United States Patent
Kim et al.

(10) Patent No.: US 11,355,679 B2
(45) Date of Patent: Jun. 7, 2022

(54) LIGHT-EMITTING DEVICE PACKAGE AND LIGHTING SOURCE DEVICE

(71) Applicant: SUZHOU LEKIN SEMICONDUCTOR CO., LTD., Taicang (CN)

(72) Inventors: Won Jung Kim, Seoul (KR); Ki Seok Kim, Seoul (KR); June O Song, Seoul (KR); Chang Man Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/760,702

(22) PCT Filed: Oct. 31, 2018

(86) PCT No.: PCT/KR2018/013115
§ 371 (c)(1),
(2) Date: Apr. 30, 2020

(87) PCT Pub. No.: WO2019/088701
PCT Pub. Date: May 9, 2019

(65) Prior Publication Data
US 2020/0335675 A1   Oct. 22, 2020

(30) Foreign Application Priority Data

Nov. 1, 2017  (KR) .................. 10-2017-0144550
Nov. 1, 2017  (KR) .................. 10-2017-0144585

(51) Int. Cl.
*H01L 33/56*     (2010.01)
*H01L 33/22*     (2010.01)
(Continued)

(52) U.S. Cl.
CPC .............. *H01L 33/56* (2013.01); *H01L 33/22* (2013.01); *H01L 33/486* (2013.01); *H01L 33/54* (2013.01); *H01L 33/60* (2013.01); *H01L 33/62* (2013.01)

(58) Field of Classification Search
CPC ......... H01L 33/54; H01L 33/62; H01L 33/60; H01L 33/486; H01L 25/167; F21K 9/00
See application file for complete search history.

(56) References Cited

U.S. PATENT DOCUMENTS

2009/0001405 A1*  1/2009  Choi ...................... H01L 24/97
                                                              257/99
2012/0286319 A1   11/2012  Lee et al.
(Continued)

FOREIGN PATENT DOCUMENTS

JP    2015-226056 A    12/2015
JP    2017-135224 A    8/2017
(Continued)

OTHER PUBLICATIONS

International Search Report issued in PCT/KR2018/013115 (PCT/ISA/210), dated Feb. 14, 2019.

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

The light emitting device package disclosed in the embodiment includes a package body including first and second frames, and a first body disposed between the first and second frames; a second body disposed on the package body and including a cavity and a sub-cavity spaced apart from the cavity; a light emitting device disposed in the cavity and including first and second bonding portions; and a protection (Continued)

device disposed in the sub-cavity, wherein the package body and the second body may be coupled to an adhesive member.

19 Claims, 15 Drawing Sheets

(51) Int. Cl.
*H01L 33/48* (2010.01)
*H01L 33/54* (2010.01)
*H01L 33/60* (2010.01)
*H01L 33/62* (2010.01)
*H01L 25/16* (2006.01)
*F21K 9/00* (2016.01)

(56) References Cited

U.S. PATENT DOCUMENTS

| | | | |
|---|---|---|---|
| 2013/0299855 A1* | 11/2013 | Ku | H01L 33/486 |
| | | | 257/88 |
| 2015/0349225 A1 | 12/2015 | Oh et al. | |
| 2017/0092826 A1* | 3/2017 | Oka | H01L 33/62 |
| 2017/0213945 A1* | 7/2017 | Yamashita | H01L 33/62 |

FOREIGN PATENT DOCUMENTS

| | | |
|---|---|---|
| KR | 10-2011-0109222 A | 10/2011 |
| KR | 10-2011-0111173 A | 10/2011 |
| KR | 10-2012-0127109 A | 11/2012 |
| KR | 10-2015-0137281 A | 12/2015 |
| KR | 10-1649300 B1 | 8/2016 |

* cited by examiner

LIGHT-EMITTING DEVICE PACKAGE AND LIGHTING SOURCE DEVICE

CROSS REFERENCE TO RELATED APPLICATIONS

This application is the National Phase of PCT International Application No. PCT/KR2018/013115, filed on Oct. 31, 2018, which claims priority under 35 U.S.C. 119(a) to Patent Application Nos. 10-2017-0144550, filed in the Republic of Korea on Nov. 1, 2017, and 10-2017-0144585, filed in the Republic of Korea on Nov. 1, 2017, all of which are hereby expressly incorporated by reference into the present application.

FIELD OF THE INVENTION

An embodiment of the invention relates to a light emitting device package, a semiconductor device package, a semiconductor device package manufacturing method, and a light source device.

BACKGROUND ART

A semiconductor device including a compound such as GaN, AlGaN and the like may have many merits such as wide and easily adjustable band gap energy, so that the semiconductor device may be used variously as a light emitting device, a light receiving device, various diodes, and the like.

Specifically, as thin film growth technology and device materials have been developed, a light emitting device, such as a light emitting diode or a laser diode, using a Group III-V or II-VI compound semiconducting material has an advantage capable of realizing light of various wavelength bands such as red, green, blue, and ultraviolet light. In addition, a light emitting device, such as a light emitting diode or a laser diode, using a Group III-V or II-VI compound semiconducting material may realize a white light source with high efficiency by using a fluorescent material or by combining colors. Such a light emitting device has advantages of low power consumption, semi-permanent lifetime, a fast response speed, safety, and environmental friendliness as compared with a conventional light source such as a fluorescent lamp, an incandescent lamp, or the like.

In addition, when a light-receiving device such as a photodetector or a solar cell is fabricated by using a Group III-V or Group II-VI compound semiconductor material, since the material of the device material has been developed, light in various wavelength ranges is absorbed to generate optical current, so that light of various wavelength ranges from gamma rays to radio wavelength regions may be used. Further, such a light receiving device may have advantages of a fast response speed, safety, environmental friendliness and easy control of device materials, so that the light receiving device may be easily used for a power control, a microwave circuit or a communication module.

Therefore, the application of the semiconductor device is expanded to a transmitting module of an optical communication transmitting module, a light emitting diode backlight serving as a substitute for a cold cathode fluorescence lamp (CCFL) constituting a backlight of a liquid crystal display (LCD), a white light emitting diode lighting device serving as a substitute for a fluorescent lamp or an incandescent lamp, a vehicle headlight, a signal lamp and a sensor for detecting gas or fire. In addition, the application of the semiconductor device may be expanded to a high-frequency application circuit, other power control devices, and a communication module.

A light emitting device may serve as a p-n junction diode having a characteristic of converting electric energy into light energy by using group III-V or II-VI elements of the periodic table, and may provide various wavelengths by controlling the composition ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

Research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, in the semiconductor device package, studies on a method for reducing the manufacturing cost and improving the manufacturing yield by improving the process efficiency and changing the structure have been performed.

SUMMARY OF THE INVENTION

An embodiment of the invention provides a light emitting device package having a light emitting device in a cavity and a protection device embedded in a body having the cavity.

An embodiment of the invention provides a light emitting device package in which a protection device is disposed in an upper body disposed on the upper portion of the frame, and a method of manufacturing the same.

An embodiment of the invention provides a light emitting device package in which the light emitting device and the protection device overlap in the vertical direction, and a method of manufacturing the same.

An embodiment of the invention provides a light emitting device package in which the protection device is disposed in a region overlapping the light emitting device perpendicularly of the region of the frame or the first body, and a method of manufacturing the same.

An embodiment of the invention provides a light emitting device package in which the protection device is disposed between the light emitting device and the frame, and a method of manufacturing the same.

An embodiment of the invention provides a light emitting device package having a recess and a first resin between the light emitting device and the body.

An embodiment of the invention provides a light emitting device package in which a through hole is disposed in a body or a frame overlapping the light emitting device in a vertical direction, and a conductive portion connected to the light emitting device is disposed in the through hole, and a method of manufacturing the same.

An embodiment of the invention may provide a light emitting device package, a manufacturing method thereof, and a light source device capable of improving light extraction efficiency and electrical characteristics.

An embodiment of the invention may provide a light emitting device package and a light source device that may improve the process efficiency and propose a new package structure to reduce the manufacturing cost and improve the manufacturing yield.

An embodiment of the invention may provide a light emitting device package and a method of manufacturing the same, which may prevent re-melting from occurring in a bonding area of a package while the package is re-bonded to a substrate.

A light emitting device package according to the embodiment may comprise: a package body including a first frame, a second frame, and a first body disposed between the first frame and the second frame; a second body disposed on the package body and including a cavity penetrating an upper surface and a lower surface thereof and a sub-cavity spaced apart from the cavity; a light emitting device disposed in the cavity and including a first bonding portion and a second bonding portion; and a protection device disposed in the sub-cavity, wherein the package body and the second body may be couple to an adhesive member.

According to an embodiment of the invention, the first and second frames have a through hole, the body of the package body includes a first recess in the upper portion, and including a first resin in the first recess. The sub-cavity may be concave in a direction of an upper surface from a lower surface of the side wall constituting the cavity.

According to an embodiment of the invention, a passivation portion covering the protection device is disposed to the sub-cavity, and the adhesive member may be formed of the same material as the passivation portion.

According to an embodiment of the invention, the conductive portion is disposed in the through hole and connected to the first and second bonding portions, and the protection device is disposed on the first frame in the sub-cavity and may electrically connected to the second frame.

According to an embodiment of the invention, an outer surface of the second body may be disposed on the same vertical plane as the outer surfaces of the first and second frames and the body.

According to an embodiment of the invention, at least one of the package body and the body may be formed of a reflective resin.

According to an embodiment of the invention, the second body is formed of a resin material, and including the first metal layer connected to the first bonding portion and the protection device on the package body and a second metal layer separated from the first metal layer and connected to the second bonding portion.

According to an embodiment of the invention, the first resin may be disposed between the light emitting device and the first body.

A light emitting device package according to an embodiment of the invention comprising: at least one frame; a body disposed on the at least one frame and including a plurality of through holes; a light emitting device disposed in the cavity and including a first bonding portion and a second bonding portion; and a protection device disposed between the light emitting device and the at least one frame. The plurality of through holes may include a first through hole overlapping the first bonding portion, and a second through hole overlapping the second bonding portion, and the protection device may be disposed in the second through hole.

According to an embodiment of the invention, depths of the first through hole and the second through hole may be different from each other.

According to an embodiment of the invention, a conductive portion is disposed in the first through hole, and the conductive portion may include a material of SAC (Sn—Ag—Cu) series.

According to an embodiment of the invention, it may include a first recess on the body, and a first resin disposed in the first recess and adhered between the light emitting device and the body.

According to an embodiment of the invention, the plurality of first recesses may be arranged to be spaced apart from each other.

According to an embodiment of the invention, it may include a reflective portion having a cavity on the body, and an adhesive member coupled between the reflective portion and the body.

According to an embodiment of the invention, a passivation portion for protecting around of the protection device in the second through hole.

According to an embodiment of the invention, inner portions of the plurality of first recesses may overlap with the light emitting devices in a vertical direction, and outer portions may protrude outward from opposite sides of the light emitting devices.

The light source device according to the embodiment of the invention may provide the above light emitting device package on a circuit board.

Advantageous Effects

An embodiment of the invention may provide a package having a protection device.

According to an embodiment of the invention, a protection device may be embedded in a second body disposed around the light emitting device. Accordingly, the protection device may be removed from a space of the cavity in which the light emitting device is disposed, and the light loss may be reduced.

According to the embodiment of the invention, the light emitting device and the protection device may be disposed in a vertical direction, thereby preventing space reduction in the cavity and reducing light loss.

The package according to the embodiment of the invention has an advantage of improving light extraction efficiency, electrical characteristics, and reliability.

The package according to the embodiment of the invention has an advantage of improving process efficiency, reducing manufacturing cost, and improving manufacturing yield.

The package according to an embodiment of the invention may prevent the second body from discoloring by providing a second body having a high reflectance and improve the reliability of the package.

The package according to the embodiment of the invention may prevent the re-melting phenomenon from occurring in the bonding region of the light emitting device package during the re-bonding to the substrate.

DETAILED DESCRIPTION

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment will be described in detail with reference to accompanying drawings. The semiconductor device of the device package may include a light emitting device emitting light such as ultraviolet, infrared, or visible light. Hereinafter, as an example of a semiconductor device, a case where a light emitting device is applied will be described, and a package or a light source unit to which the light emitting device is applied may include a non-light emitting device such as a Zener diode or a sensing device for monitoring a wavelength or heat. Hereinafter, as an example of a semiconductor device, a case where a light emitting device is applied will be described, and a light emitting device package will be described in detail.

Figure 1:
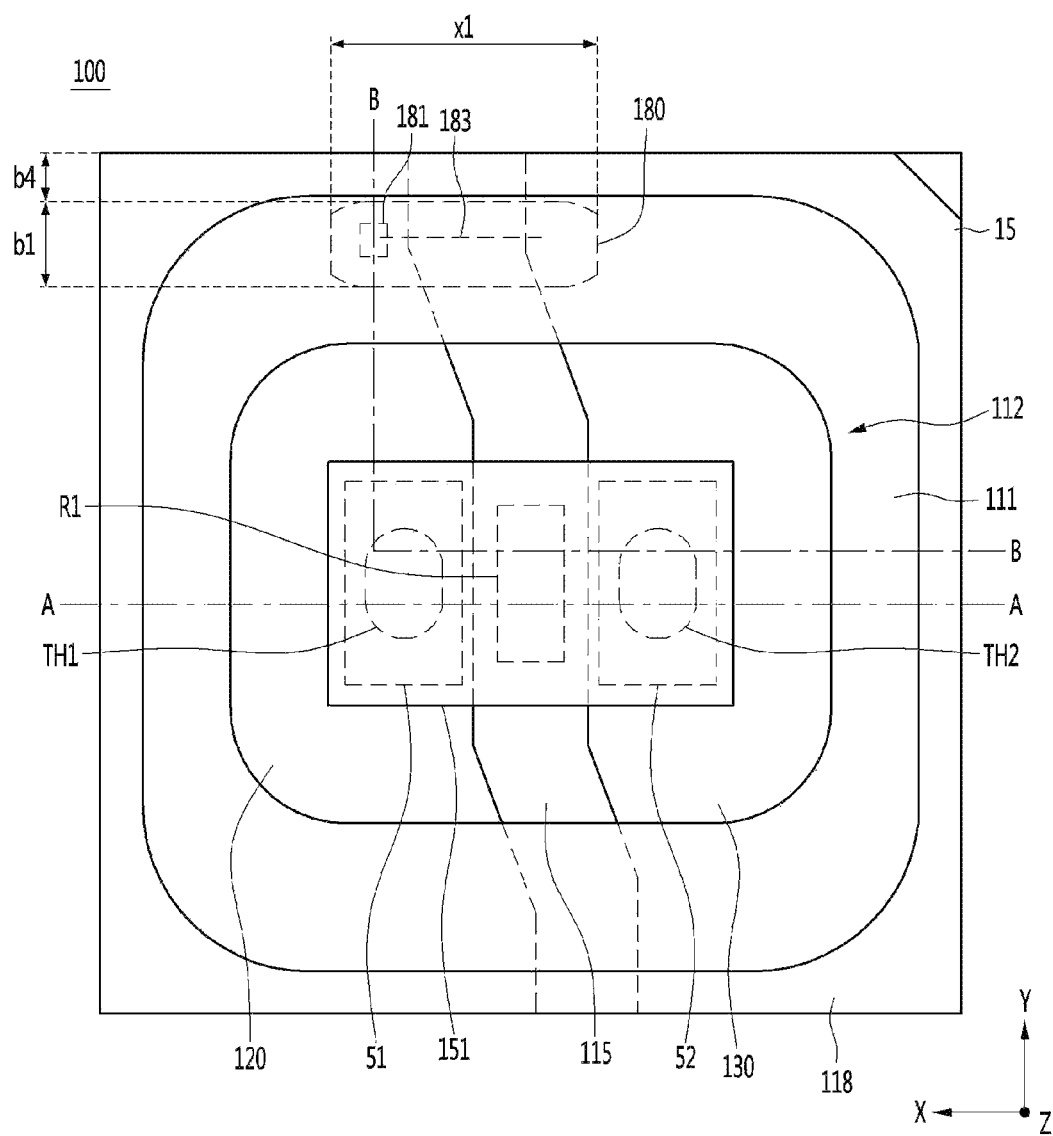
FIG. 1 is a plan view showing a light emitting device package according to a first embodiment of the invention.
Figure 2:
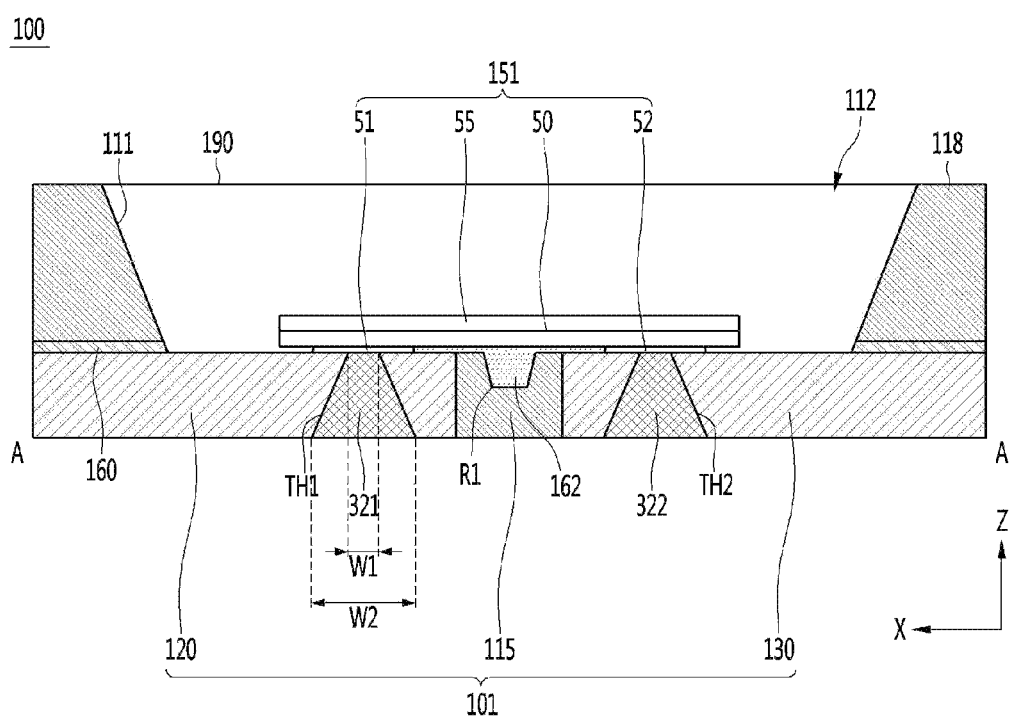
FIG. 2 is a cross-sectional view taken along the A-A side of the light emitting device package of FIG.
Figure 3:
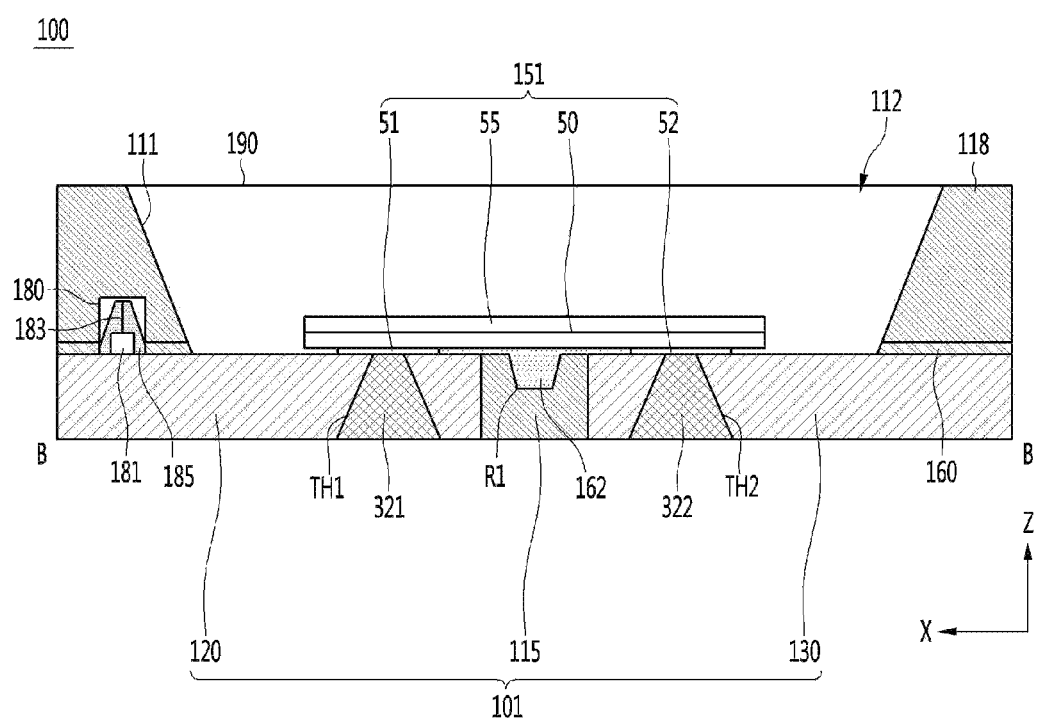
FIG. 3 is a cross-sectional view taken along the B-B side of the light emitting device package of FIG.
Figure 4:
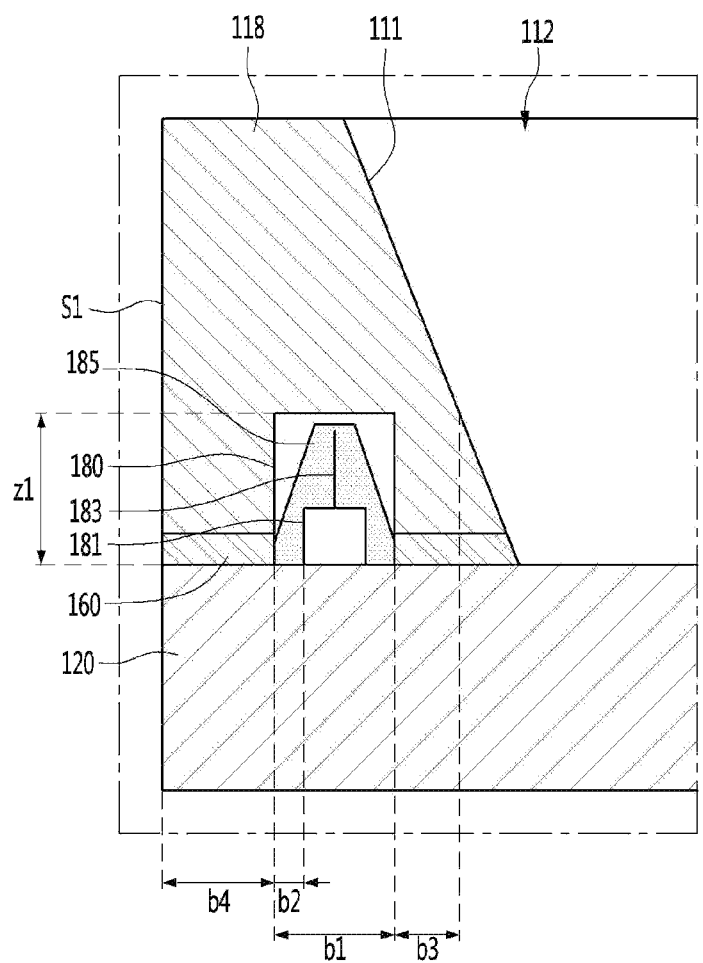
FIG. 4 is a detailed configuration diagram of the protection device and the lower recess of FIG. 3.

FIG. 1 is a plan view illustrating a light emitting device package according to an exemplary embodiment of the invention, FIG. 2 is a sectional view taken along the AA side of the light emitting device package of FIG. 1, FIG. 3 is a sectional view taken along the B-B side of the light emitting device package of FIG. 1, and FIG. 4 is a detailed configuration diagram of the protection device and the lower recess of FIG. 3.

FIGS. 1 to 4, the light emitting device package 100 includes a package body 101 having a first body 115 and frames 120 and 130, a light emitting device 151 on the package body 101, and a second body 118 around the light emitting device 151.

The first package body 101 may include a plurality of frames 120 and 130 and a first body 115 disposed between the plurality of frames 120 and 130. The plurality of frames 120 and 130 may be coupled to the first body 115. The plurality of frames 120 and 130 may be supported by the first body 115. The plurality of frames 120 and 130 may include a first frame 120 disposed in a first region of the first body 115 and a second frame 130 disposed in a second area of the first body 115. The first and second frames 120 and 130 may be spaced apart in the first direction X, and the first body 115 may be disposed between the first and second frames 120 and 130. A portion of the first body 115 may be disposed along a second direction Y perpendicular to the first direction.

The plurality of frames 120 and 130 may be conductive frames. The plurality of frames 120 and 130 may be metal frames, for example, and may be selected of copper (Cu), titanium (Ti), nickel (Ni), gold (Au), chromium (Cr), tantalum (Ta), or platinum (Pt), tin (Sn), silver (Ag), and may be formed in a single layer or multiple layers.

Here, the light emitting device 151 may be disposed on the plurality of frames 120 and 130. The light emitting device 151 may include a first bonding portion 51 disposed on the first frame 120 and a second bonding portion 52 disposed on the second frame 130.

At least one or both of the plurality of frames 120 and 130 may include through holes TH1 and TH2. The through holes TH1 and TH2 may include a first through hole TH1 disposed in the first frame 120 and a second through hole TH2 disposed in the second frame 130. The first and second through holes TH1 and TH2 may be spaced apart from each other in the first direction. The first through hole TH1 may be a hole penetrating from an upper surface to a lower surface of the first frame 120. The second through hole TH2 may be a hole penetrating from an upper surface to a lower surface of the second frame 130. The depths of the first and second through holes TH1 and TH2 may be the same as the thicknesses of the first and second frames 120 and 130.

The first and second through holes TH1 and TH2 may have a top view shape having a circular shape, a polygon shape, an ellipse shape, or a shape having a curved line and a straight line. In the side cross-section views of the first and second through holes TH1 and TH2, the width of the upper portion and the width of the lower portion may be different from each other. The widths of the lower portions of the first and second through holes TH1 and TH2 may be wider than widths of the upper portions. As another example, the widths of an upper portion and the lower portion of the first and second through holes TH1 and TH2 may be the same.

The width in the horizontal direction in the side cross-sections of the first and second through holes TH1 and TH2 may be gradually wider toward the lower portion. The first and second through holes TH1 and TH2 have the width of the upper portion that is wider than the width of the lower portion and may be inclined. As another example, side surfaces of the first and second through holes TH1 and TH2 may be curved surfaces having curvatures or curved surfaces having different curvatures.

The first and second through holes TH1 and TH2 may have a width in the X direction equal to or smaller than a length in the Y direction. Since the length of the X direction in the light emitting device 151 is equal to or larger than the length of the Y direction, each of the first and second through holes TH1 and TH2 may further increase the Y direction based on the size of the light emitting device 151.

An interval between the first through hole TH1 and the second through hole TH2 in the lower region of the first frame 120 and the second frame 130 may provide 100 micrometers or more, for example, in a range of 100 micrometers to 600 micrometers. The interval between the first and second through holes TH1 and TH2 may be wider than the width of the upper surface of the first body 115. The interval between the first and second through holes TH1 and TH2 may be a minimum distance for preventing the light emitting device package 100 from generating an electrical short between pads on a circuit board or a sub-mount. The interval between the first and second through holes TH1 and TH2 may vary depending on the size of the light emitting device 151. The first and second through holes TH1 and TH2 are disposed such that the width W1 of the upper region is equal to or narrower than the width W2 of the lower region, thereby opening the first and second through holes TH1 and TH2. The degradation of the stiffness of the frames 120 and 130 may be prevented and an electrical path may be provided.

Here, one or more first through holes TH1 may be provided in the first frame 120. The first through hole TH1 may overlap the light emitting device 151 in a vertical direction. The first through hole TH1 may be disposed under the first bonding portion 51 of the light emitting device 151. The first through hole TH1 may overlap the first bonding portion 51 of the light emitting device 151 in the Z direction. The first through hole TH1 may pass through the first frame 120 and be connected to the first bonding portion 51 of the light emitting device 151. The first through hole TH1 may penetrate the upper and lower surfaces of the first frame 120 in the Z direction and expose the lower surface of the first bonding portion 51. The first through hole TH1 may be provided to overlap the first bonding portion 51 of the light emitting device 151 in the Z direction from the upper surface of the first frame 120 to the lower surface. By exposing the first bonding portion 51 through the first through hole TH1, an electrical path and a heat dissipation path through the conductive material or the first conductive portion 321 disposed in the first through hole TH1 may be provided.

One or more second through holes TH2 may be provided in the second frame 130. The second through hole TH2 may overlap the light emitting device 151 in a vertical direction. The second through hole TH2 may be disposed under the second bonding portion 52 of the light emitting device 151. The second through hole TH2 may overlap the second bonding portion 52 of the light emitting device 151 in the Z direction. The second through hole TH2 may pass through the second frame 130 and be connected to the second bonding portion 52 of the light emitting device 151. The second through hole TH2 may be provided through the upper and lower surfaces of the second frame 130 in the Z direction. By exposing the second bonding portion 52 through the second through hole TH2, an electrical path and a heat dissipation path through the conductive material or the second conductive portion 322 disposed in the second through hole TH2 may be provided.

An upper area of each of the first and second through holes TH1 and TH2 may have a range of 30% or more, for example, in a range of 30% to 100% of an area of the lower surface of each of the first and second bonding portions 51 and 52. The first through hole TH1 and the first bonding portion 51 may face each other. The second through hole TH2 and the second bonding portion 52 may face each other. Therefore, the first bonding portion 51 and the first frame 120 of the light emitting device 151 may be attached by a material provided by the first through hole TH1. The second bonding portion 52 and the second frame 130 of the light emitting device 151 may be attached by a material provided in the second through hole TH2. The material provided in the first through hole TH1 may be a conductive material such as a metal layer or the first conductive portion 321. The material provided in the second through hole TH2 may be a conductive material such as a metal layer or a second conductive portion 322 such as solder.

The distance from the upper region of the first through hole TH1 to the end of the lower surface of the first bonding portion 51 in the X direction may be provided at 40 micrometers or more, for example, in a range of 40 to 60 micrometers. The distance from the upper region of the second through hole TH2 to the end of the lower surface of the second bonding portion 52 in the X direction may be provided at 40 micrometers or more, for example, 40 to 60 micrometers. When the distance is more than 40 micrometers, a process margin may be secured so that the first and second bonding portions 51 and 52 are not exposed from the lower surfaces of the first and second through holes TH1 and TH2. When the distance is less than 60 micrometers, an area of the first and second bonding portions 51 and 52 exposed to the first and second through holes TH1 and TH2 may be secured, and a resistance of the first and second bonding portions 51 and 52 exposed by the first and second through holes TH1 and TH2 may be lowered, so that the current injection into the second bonding portions 51 and 52 exposed by the first and second through holes TH1 and TH2 may be smoothly inject.

The first body 115 may be disposed between the first and second frames 120 and 130 and may be disposed between the first and second through holes TH1 and TH2. The first body 115 may be formed to have the same thickness as that of the first and second frames 120 and 130.

The first body 115 may be an insulating material or a resin material. The first body 115 may include at least one selected from the group consisting of Polyphthalamide (PPA), Polychloro triphenyl (PCT), liquid crystal polymer (LCP), polyamide 9T (PA9T), silicone, epoxy molding compound (EMC), silicon molding compound (SMC), ceramic, polyimide (PI), photo sensitive glass (PSG), sapphire (Al2O3) and the like. When the first body 115 is a resin material, the first body 115 may be formed of a material including a metal oxide, for example, TiO2, SiO2, Al2O3, or the like.

The upper surface of the first body 115 may be disposed on the same plane as the upper surfaces of the first frame 120 and the second frame 130. A portion of the upper surface of the first body 115 may extend on the upper surfaces of the first frame 120 and the second frame 130 to support the first and second frames 120 and 130. The lower surface of the first body 115 may be disposed on the same plane as the lower surfaces of the first frame 120 and the second frame 130.

The light emitting device package 100 according to the embodiment may include a first recess R1. The first recess R1 may be recessed in a direction of the lower surface from an upper surface of the first body 115. The first recess R1 may be exposed to the bottom surface of the cavity 112 or may be connected to the cavity 112. The first recess R1 may be provided in the first body 115. One or more first recesses R1 may be disposed on the first body 115.

The first recess R1 may be disposed between the first and second through holes TH1 and TH2. At least some or all regions of the first recess R1 may be disposed to overlap the light emitting device 151 in the vertical direction. The outside of the first recess R1 may not overlap with the light emitting device 151 in the vertical direction. The first recess R1 may be a region in which an upper portion of the first body 115 is recessed to be concave, and may be disposed lower than upper surfaces of the first frame 120 and the second frame 130. A portion of the first recess R1 may be disposed under the light emitting device 151. The first recess R1 may be disposed at the center of a lower surface of the light emitting device 151 or at both sides of the lower surface of the light emitting device 151. The first recess R1 may be disposed not to overlap the first and second frames 120 and 130 in the vertical direction.

The second body 118 may be disposed on the package body 101. The second body 118 may be disposed on the outer side of the upper surface of the package body 101. The second body 118 may be disposed on the package body 101 and include a cavity 112. The cavity 112 of the second body 118 may be an opening penetrating the upper surface (15 in FIG. 1) and the lower surface of the second body 118.

As another example, the package body 101 may be defined as a lower body, and the second body 118 may be defined as an upper body. According to an embodiment, the package body 101 does not include the second body 118 providing the cavity 112 and may provide as the package body 101 having a flat top surface.

The second body 118 may reflect the light emitted from the light emitting device 151 in an upward direction. The side surface 111 of the cavity 112 of the second body 118 may be inclined with respect to the upper surface of the package body 101.

The second body 118 may include the cavity 112. The cavity 112 may include a bottom surface and a side surface 111 inclined from the bottom surface to the upper surface of the second body 118.

For example, the second body 118 may include at least one selected from the group consisting of Polyphthalamide (PPA), Polychloro triphenyl (PCT), liquid crystal polymer (LCP), polyamide 9T (PA9T), silicone, epoxy molding compound (EMC), silicon molding compound (SMC), ceramic, polyimide (PI), photo sensitive glass (PSG), sapphire (Al2O3) and the like. In addition, the second body 118 may include a reflective material of a high refractive filler such as TiO2 and SiO2. The second body 118 may include a wavelength conversion material such as a quantum dot or a phosphor. The second body 118 may be formed of a light transmitting material.

Figure 11:
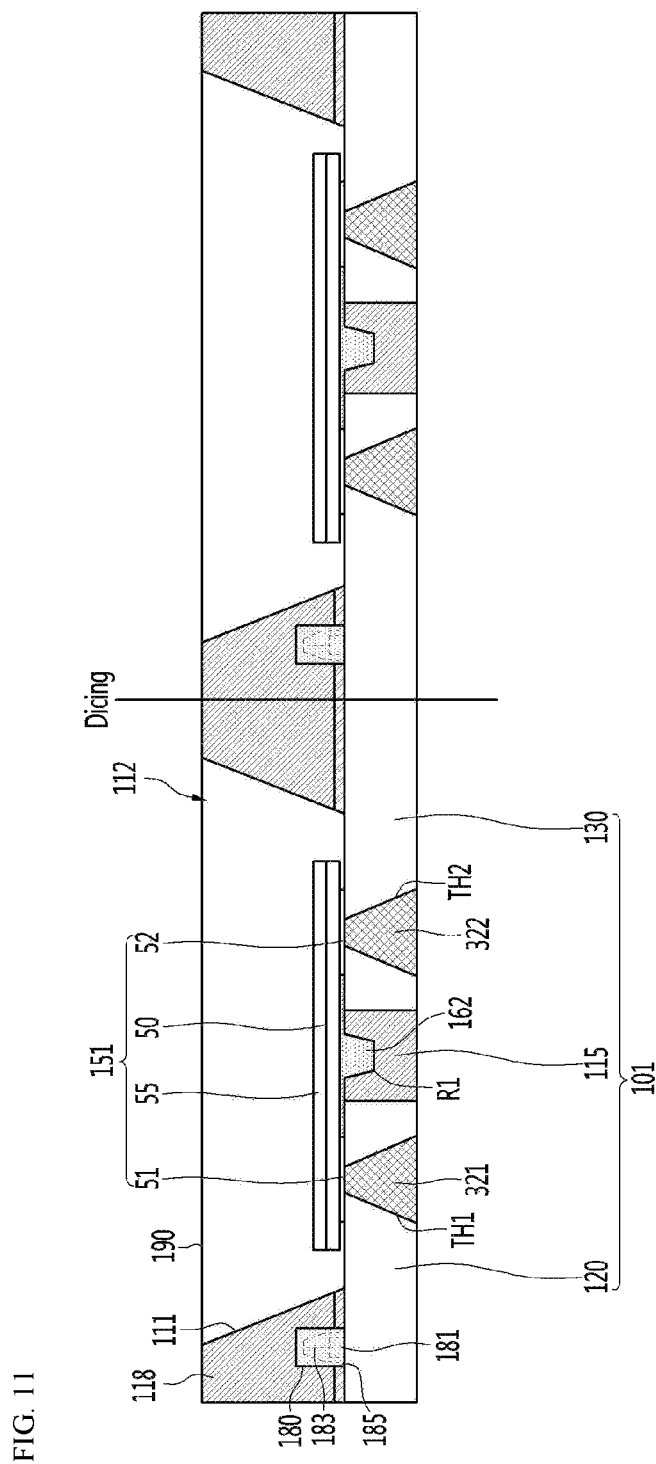

As shown in FIG. 4, one side surface 51 or all side surfaces of the second body 118 may be disposed on the same plane as the side surface of the package body. Here, as shown in FIG. 11, when the package body 101 and the second body 118 are coupled to each other, the package body 101 and the second body 118 are provided by dicing in a package unit so that the side surfaces of the package body 101 and the second body 118 may be disposed on the same vertical plane.

Referring to FIGS. 1 to 3, the light emitting device 151 may be disposed on the first and second frames 120 and 130. The light emitting device 151 may be disposed on the first and second frames 120 and 130 and the first body 115. The light emitting device 151 may be disposed to overlap the first and second frames 120 and 130 and the first body 115 in the vertical direction (Z). The light emitting device 151 may be disposed in a flip chip shape on the first and second frames 120 and 130.

The light emitting device 151 may emit blue light, green light, red light, or ultraviolet light. The light emitting device 151 may selectively emit light in a range of ultraviolet light to visible light.

The light emitting device 151 may be disposed on the package body 101. The light emitting device 151 may be disposed on the first body 115. The light emitting device 151 may be disposed in the cavity 112 of the second body 118.

The light emitting device 151 may include a first bonding portion 51 and a second bonding portion 52. The first bonding portion 51 and the second bonding portion 52 may be disposed on one surface of the light emitting device 151. The other surface opposite to one surface of the light emitting device 151 may be a surface from which light is extracted. The first bonding portion 51 and the second bonding portion 52 may be disposed under the light emitting device 151, and the first and second bonding portions 51 and 52 may be spaced apart in the first direction.

The light emitting device 151 may include a light emitting structure 50. The light emitting device 151 may include a substrate 55 on the light emitting structure 50. The light emitting structure 50 may be disposed on the first and second bonding portions 51 and 52. The first and second bonding portions 51 and 52 may be disposed between the light emitting structure 50 and the first and second frames 120 and 130. The substrate 55 is a light transmitting layer and may be formed of an insulating material or a semiconductor material. The substrate 55 may be selected from, for example, a group including sapphire substrate (Al2O3), SiC, GaAs, GaN, ZnO, Si, GaP, InP, and Ge. For example, an uneven pattern may be formed on a surface of the substrate 55. The substrate 55 may be removed or another light transmitting layer may be disposed. The substrate 55 may be disposed on an uppermost layer of the light emitting device 151 or may function as a light extraction layer. The light emitting structure 50 may be disposed between the substrate 55 and the first and second bonding portions 51 and 52. The light emitting structure 50 may be exposed on the upper portion of the light emitting device 151 when the substrate 55 is removed. The light emitting structure 50 may be provided as a compound semiconductor. The light emitting structure 50 may be provided as, for example, a compound semiconductor of Group II-VI elements or Group III-V elements. For example, the light emitting structure 50 may include at least two elements selected from aluminum (Al), gallium (Ga), indium (In), phosphorus (P), arsenic (As), and nitrogen (N). The light emitting structure 50 may include a first conductivity type semiconductor layer, a second conductivity type semiconductor layer, an active layer disposed between the first conductivity type semiconductor layer and the second conductivity type semiconductor layer. The first and second conductivity type semiconductor layers may be implemented as at least one of compound semiconductors of Groups III-V elements or II-VI elements. Each of the first and second conductivity type semiconductor layers may be formed of a semiconductor material, for example, having a composition formula of InxAlyGa1−x−yN (0≤x≤1, 0≤y≤1, 0≤x+y≤1). For example, each of the first and second conductivity type semiconductor layers may include at least one selected from the group consisting of GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer doped with an n-type dopant such as Si, Ge, Sn, Se, Te, or the like. The second conductivity type semiconductor layer may be a p-type semiconductor layer doped with p-type dopants such as Mg, Zn, Ca, Sr, and Ba. The first conductivity type semiconductor layer may be disposed between the substrate 55 and the active layer. The second conductivity type semiconductor layer may be disposed between the active layer and the first and second bonding portions 51 and 52.

The first bonding portion 51 may be electrically connected to the first conductivity type semiconductor layer. The second bonding portion 52 may be electrically connected to the second conductivity type semiconductor layer. On the contrary, the second bonding portion 52 may be electrically connected to the first conductivity type semiconductor layer. The first bonding portion 51 may be electrically connected to the second conductivity type semiconductor layer.

The first bonding portion 51 may be disposed between the light emitting structure 53 and the first frame 120. The second bonding portion 52 may be disposed between the light emitting structure 53 and the second frame 130. The first bonding portion 51 and the second bonding portion 52 may include a metal material. The first and second bonding portions 51 and 52 may be formed in a single layer or multiple layers using one or more materials of Ti, Al, Sn, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO, or alloys thereof.

The first and second bonding portions 51 and 52 may be electrodes or pads. The light emitting device 151 may be driven by driving power supplied through the first bonding portion 51 and the second bonding portion 52. In addition, the light emitted from the light emitting device 151 may be provided in an upper direction of the cavity 112.

When viewed from the top view of the light emitting device 151, the first recess R1 of the first body 115 may be disposed between the first bonding portion 51 and the second bonding portion 52. The depth of the first recess R1 in the vertical direction may be smaller than the depth of the first through hole TH1. The depth of the first recess R1 may be determined not to cause cracks in the light emitting device package 100 by considering a stable strength of the first body 115 and/or by heat emitted from the light emitting device 151.

The light emitting device package 100 according to the embodiment may include a first resin 162. The first resin 162 may be disposed in the first recess R1. The first resin 162 may be disposed between the light emitting device 151 and the first body 115. The first resin 162 may be attached to a lower surface of the light emitting device 151 and an upper surface of the first body 115. The first resin 162 may be adhered to the lower surface of the light emitting device 151 and the upper surfaces of the first and second frames 120 and 130. The first resin 162 may be disposed between the first bonding portion 51 and the second bonding portion 52. For example, the first resin 162 may be in contact with the side surface of the first bonding portion 51 and the side surface of the second bonding portion 52.

The first resin 162 may provide a stable fixing force between the light emitting device 151 and the first body 115. The first resin 162, for example, may be in direct contact with an upper surface of the first body 115. The first resin 162 may directly contact the lower portion of the light emitting device 151. For example, the first resin 162 may include at least one of an epoxy-based material, a silicon-based material, a hybrid material including an epoxy-based material and a silicon-based material. In addition, the first resin 162 may reflect light emitted from the light emitting device 151. When the first resin 162 includes a reflective material, the first resin 162 may include white silicone, and the reflective material may include $TiO_2$, $SiO_2$, or $Al_2O_3$.

The first recess R1 may provide an appropriate space in which a kind of underfill process may be performed under the light emitting device 151. The first recess R1 may be greater than or equal to a first depth and less than or equal to a second depth between a lower surface of the light emitting device 151 and an upper surface of the first body 115. The first depth may be a depth at which the first resin 162 may be sufficiently provided, and the second depth may be a depth capable of providing stable strength of the first body 115. The depth and width of the first recess R1 may affect the formation position and the fixing force of the first resin 162. For example, the depth of the first recess R1 may range from 20 micrometers to 60 micrometers. In addition, the width of the first recess R1 may range from 140 micrometers to 160 micrometers in the first direction.

As shown in FIGS. 2 and 3, the first body 115 and the second body 118 may include different materials. For example, the first body 115 and the second body 118 may be combined after being formed of different materials in different processes. For example, the package body 101 and the second body 118 may be coupled to each other through an adhesive member 160. The adhesive member 160 may be disposed between the package body 101 and the second body 118. The adhesive member 160 may be disposed on an upper surface of the package body 101. The adhesive member 160 may be disposed on the lower surface of the second body 118. The adhesive member 160 may be disposed around the light emitting device 151 and may extend in the direction of the cavity 112 or may be exposed to the cavity 112.

The adhesive member 160 may include at least one of an epoxy-based material, a silicon-based material, a hybrid material including an epoxy-based material and a silicon-based material. In addition, the adhesive member 160 may reflect light emitted from the light emitting device 151. When the adhesive member 160 includes a reflective function, the adhesive may include white silicone.

Meanwhile, each of the first body 115 and the second body 118 may include at least one selected from a resin material of Polyphthalamide (PPA), Polychloro triphenyl (PCT), liquid crystal polymer (LCP), polyamide 9T (PA9T), silicone, epoxy, epoxy molding compound (EMC), silicone molding compound (SMC), polyimide (PI), and the like, as a base material. Each of the first body 115 and the second body 118 may include at least one of a reflective material and a wavelength converting material. The first body 115 and the second body 118 may not include a reflective material and a wavelength converting material. The first body 115 and the second body 118 may be made of a transparent resin. The first body 115 and the second body 118 may include different base materials. As a first example, the first body 115 may include a reflective material and the second body 118 may include a wavelength converting material. The first body 115 may include a wavelength conversion material and the second body 118 may include a reflective material. As a second, the first body 115 may include a reflective material and the second body 118 may include a reflective material and a wavelength converting material. As a third example, the first body 115 may include a reflective material and a wavelength converting material, and the second body 118 may include a wavelength converting material.

According to an embodiment of the invention, conductive portions 321 and 322 may be disposed in the first and second through holes TH1 and TH2, respectively. The depths of the first and second through holes TH1 and TH2 may be provided 2 times to 20 times of the depth of the first recess R1. For example, when the depths of the first and second through holes TH1 and TH2 are provided at 200 micrometers, the depth of the first recess R1 may be provided at 20 micrometers to 100 micrometers. The conductive portions 321 and 322 may be spaced apart from the first body 115 and the first recess R1.

The conductive portions 321 and 322 may be provided in the first and second through holes TH1 and TH2. The first conductive portion 321 may be disposed in the first through hole TH1, and the second conductive portion 322 may be disposed in the second through hole TH2. The light emitting device package 100 may be provided without the first and second conductive portions 321 and 322, or may have a structure having the conductive portions 321 and 322 in the first and second through holes TH1 and TH2.

The first through hole TH1 and the first conductive portion 321 may be disposed under the first bonding portion 51. The second through hole TH2 and the second conductive portion 322 may be disposed under the second bonding portion 52. Widths of upper portions of the first and second conductive portions 321 and 322 may be smaller than upper widths of the first and second bonding portions 51 and 52. Widths of the lower portions of the first and second conductive portions 321 and 322 may be smaller than widths of the lower portions of the first and second bonding portions 51 and 52.

The conductive portions 321 and 322 may directly contact lower surfaces of the first and second bonding portions 51 and 52. The conductive portions 321 and 322 may be electrically connected to the first and second bonding portions 51 and 52. The conductive portions 321 and 322 may be disposed to be surrounded by the first and second frames 120 and 130.

The conductive portions 321 and 322 may include one material selected from the group including Ag, Au, Pt, Sn, Cu, or an alloy thereof. However, the invention is not limited thereto and a material capable of securing a conductive function may be used as the conductive portions 321 and 322.

The conductive portions 321 and 322 or a conductive material may be used for the first and second through holes TH1 and TH2. The conductive portions 321 and 322 are solder pastes, and may be formed by mixing powder particles or particle particles with flux. For example, the conductive portions 321 and 322 may be formed using a conductive paste. The conductive paste may include a solder paste, a silver paste, or the like, and may include a multilayer or a single layer composed of a multilayer or an alloy composed of different materials. For example, the conductive portions 321 and 322 may include a SAC (Sn—Ag—Cu) material or a SAC-based material.

At least one of the bonding portions 51 and 52 may be bonded by an intermetallic compound layer. The intermetallic compound may include at least one of $Cu_xSn_y$, $Ag_xSn_y$, and $Au_xSn_y$, and the x may satisfy a condition of $0<x<1$, $y=1-x$, $x>y$. In the light emitting device package of the invention, a conductive material such as conductive portions 321 and 322 or a conductive paste may be formed in at least one or both of the through holes TH1 and TH2. The conductive portions 321 and 322 disposed in the first and second through holes TH1 and TH2 are 30% or more, for example, 30% to 100% of the volume of the first and second through holes TH1 and TH2, and when it is less than the above range, the electrical reliability may be lowered, and when it is greater than the above range, the bonding force with the circuit board may be lowered due to the protrusion of the conductive portions 321 and 322.

The first bonding portion 51 of the light emitting device 151 may be formed in an alloy layer with an intermetallic compound (IMC) between the first conductive portion 321 and the first frame 120 or/and the first bonding portion 51 by a forming process of the first conductive portion 321 or heat treatment process after the first conductive portion 321 is provided and the material constituting the first conductive portion 321. The alloy layer may include at least one intermetallic compound layer selected from the group including AgSn, CuSn, AuSn, and the like. The intermetallic compound layer may be formed by combining a first material and a second material, a first material may be provided from the first conductive portion 321, and a second material may be provided from the first bonding portion 51. The second bonding portion 52 of the light emitting device 151 may be formed in an alloy layer with an intermetallic compound (IMC) between the second conductive portion 322 and the second frame 130 or/and the second bonding portion 52 by a forming process of the second conductive portion 322 or heat treatment process after the second conductive portion 322 is provided and the material constituting the second conductive portion 322. The alloy layer may include at least one intermetallic compound layer selected from the group including AgSn, CuSn, AuSn, and the like. The intermetallic compound layer may be formed by combining a first material and a second material, the first material may be provided from the second conductive portion 322, and the second material may be provided from the second bonding portion 52.

When the conductive portions 321 and 322 include a Sn material and the metal layer contacted with the conductive portions 321 and 322 includes an Ag material, the intermetallic compound layer of AgSn may be formed by combining the materials of the Sn material and the Ag material in a process in which the conductive portions 321 and 322 are provided or in a heat treatment process after being provided. Alternatively, when the conductive portions 321 and 322 include a Sn material and the metal layer contacted with the conductive portions 321 and 322 includes an Au material, the intermetallic compound may include an AuSn layer. Alternatively, when the conductive portions 321 and 322 include a Sn material and the metal layer contacted with the conductive portions 321 and 322 includes a Cu material, the intermetallic compound may include a CuSn layer. Alternatively, when the conductive portions 321 and 322 include Ag material and some layers of the metal layer contacting the conductive portions 321 and 322 include Sn material, the intermetallic compound may include an AgSn layer. The intermetallic compound layer may have a higher melting point than other bonding materials. The heat treatment process in which the metal compound layer is formed may be performed at a lower temperature than the melting point of the general bonding material. Therefore, when the light emitting device package 100 according to the embodiment is bonded through a reflow process to a main board, re-melting does not occur, and thus the electrical connection and physical bonding force are not deteriorated.

In addition, the light emitting device package 100 according to the embodiment may prevent the package body from being exposed to high temperature in the process of manufacturing the package, thereby preventing damage or discoloration. Therefore, the selection range for the material constituting the first body 115 may be widened. The first body 115 may be provided using a relatively inexpensive resin material as well as an expensive material such as a ceramic.

In some embodiments, the first conductive portion 321 of the first through hole TH1 may be electrically connected to the first bonding portion 51, and the second conductive portion 322 of the second through hole TH2 may be electrically connected to the second bonding portion 52. For example, external power may be supplied to the conductive portions 321 and 322 disposed in the first and second through holes TH1 and TH2, and the light emitting device 151 may be driven. The first and second bonding portions 51 and 52 of the light emitting device 151 may be electrically connected to the conductive portions 321 and 322 and the first and second frames 120 and 130.

Here, in the package manufacturing process, a part of the conductive portions 321 and 322 may be moved outwardly of the light emitting device 151 and may be in contact with the side surface of the light emitting device 151. When the conductive portions 321 and 322 are moved in the lateral direction of the light emitting device 151, the first and second conductivity type semiconductor layers of the light emitting device 151 may be electrically shorted. When the first and second conductive portions 321 and 322 are moved to the side surface of the light emitting device 151, the light extraction efficiency of the light emitting device 151 may be reduced. To this end, the first resin 162 disposed around the lower portion of the light emitting device 151 may block the conductive portions 321 and 322 from leaving the region. Since the first resin 162 covers the periphery of the interface between the bonding portions 51 and 52 of the light emitting device 151 and the frames 120 and 130, the diffusion of the conductive portions 321 and 322 may be prevented. The first resin 162 may prevent the conductive portions 321 and 322 from moving to the side surface of the light emitting device 151, and may prevent an electrical short circuit of the light emitting device 151 and improve light extraction efficiency.

The light emitting device package 100 may include a protection device 181. The protection device 181 may be disposed on at least one of the first and second frames 120 and 130. The protection device 181 may be disposed on the first frame 120 and connected to the second frame 130 by a wire 183. The protection device 181 may be connected in parallel with the light emitting device 151 and may protect the light emitting device 151. The protection device 181 may be implemented with, for example, a thyristor, a Zener diode, or a transient voltage suppression (TVS) diode.

The protection device 181 may be disposed in the sub-cavity 180 of the second body 118. The sub-cavity 180 may be recessed in a direction of an upper surface from a lower surface of the side wall constituting the cavity 112. The sub-cavity 180 may be disposed to be recessed in a direction of the upper surface of the second body 118 from the lower surface of the second body 118. The sub-cavity 180 may be spaced apart from the side surface 111 of the cavity 112 and the side surface of the second body 118. Referring to FIGS. 1 and 4, the sub-cavity 180 may have a length x1 in a first direction longer than a width b1 in a second direction. The length x1 of the sub-cavity 180 may be larger than the length of the wire 183, and the width b1 may be larger than the width of the protection device 181. The length x1 may be arranged in the range of 500 micrometers or more, for example, 500 to 1300 micrometers. When the length x1 is smaller than the range, the bonding process of the wire 183 may be difficult, and when larger than the range, the outer wall stiffness of the second body 118 may be degraded. The width b1 may be in the range of 250 micrometers or more, for example, 250 to 500 micrometers, and when the width b1 is smaller than the range, the insertion of the protection device 181 may not be easy, and the outer wall stiffness of the second body 118 may be lowered.

The height z1 of the sub-cavity 180 is a distance from upper surfaces of the first frame 120 and the second frame 130 and may be greater than the width b1. The height z1 of the sub-cavity 180 may be in a range of 300 micrometers or more, for example, 300 to 450 micrometers, and when it is smaller than the range, there may be no space between the wire 183, and when it is larger than the range, the stiffness of the upper portion of the outer wall of the second body 118 may be reduced. Since the sub-cavity 180 is disposed outside the cavity 112, the larger the space of the sub-cavity is, the more light emitted from the light emitting device 151 may be transmitted to the sub-cavity 180 and is a problem being lost. Accordingly, the space of the sub-cavity 180 is provided in the above range, thereby suppressing transmission of light emitted from the light emitting device 151 and preventing a decrease in reflection efficiency.

The protection device 181 may have a distance b2 to a side surface of the sub-cavity 180 of 50 micrometers or less, for example, in a range of 5 to 50 micrometers. The protection device 181 may be spaced apart from the side surface of the sub-cavity 180 in the above range, thereby providing an insertion space of the protection device 181.

The sub-cavity 180 may be spaced apart from the side surface 111 of the cavity 112. Referring to, FIGS. 1 and 3, at least a portion of the sub-cavity 180 may overlap the side surface 111 of the cavity 112 in the vertical direction. The sub-cavity 180 may have a minimum distance b3 from the side surface 111 of the cavity 112 to a range of 150 micrometers or more, for example, 150 to 250 micrometers. When the distance b3 is smaller than the range, problems of light transmission loss and degradation of outer wall stiffness may occur, and when the distance b3 is larger than the range, the size of the second body 118 may be increased. The sub-cavity 180 is a range in which the minimum distance b4 of the second body 118 does not decrease the outer wall stiffness, and may be 150 micrometers or more, for example, in the range of 150 to 250 micrometers. The distances b3 and b4 may be the same or different from each other.

The passivation portion 185 may be disposed in the sub-cavity 180. The passivation portion 185 may be formed of the same material as the adhesive member 160 or may be a reflective or insulating material. The passivation portion 185 may arrange the protection device 181 and then cover the protection device 181 and the wire 183. The passivation portion 185 may be formed in the process of forming the adhesive member 160. The passivation portion 185 may protect the protection device 181 and the wire 183 and enhance adhesion. The passivation portion 185 may be attached to the protection device 181 and the first frame 120, and may attach the protection device 181 to the first frame 120.

The passivation portion 185 may be in contact with the adhesive member 160. The adhesive member 160 may be exposed to the sub-cavity 180 and may be connected to the passivation portion 185. The upper surface of the passivation portion 185 may be disposed lower than the upper surface of the sub-cavity 180. The volume of the outer portion of the passivation portion 185 may be smaller than the volume of the sub-cavity 180. The passivation portion 185 may be spaced apart from the surface of the sub-cavity 180 by a predetermined distance to cover the protection device 181 and the wire 183, thereby enhancing the adhesion of the passivation portion 185. The sub-cavity 180 may include an air gap. The air gap may be disposed between the passivation portion 185 and the second body 118. The passivation portion 185 may include at least one of an epoxy-based material, a silicon-based material, a hybrid material including an epoxy-based material and a silicon-based material. When the passivation portion 185 includes a reflection function, the passivation portion 185 may include white silicone.

The light emitting device package 100 may include a molding portion 190. The molding portion 190 may be provided on the light emitting device 151. The molding portion 190 may be disposed on the first body 115. The molding portion 190 may be disposed in the cavity 112 of the second body 118.

The molding portion 190 may include an insulating material. In addition, the molding portion 190 may include wavelength conversion means for receiving the light emitted from the light emitting device 151 and providing the wavelength-converted light. For example, the molding portion 190 may be at least one selected from the group including phosphors, quantum dots, and the like. The light emitting device 151 may emit light of blue, green, red, white, infrared or ultraviolet light. The phosphor or quantum dot may emit light of blue, green, and red. The molding portion 190 may not be formed. As another example, in the light emitting device package 100 according to the embodiment, a phosphor layer may be disposed on a surface of the light emitting device 151. The phosphor layer disposed on the surface of the light emitting device 151 may be disposed between the light emitting device 151 and the molding portion 190, and may include at least one or two or more of red phosphor, green phosphor, yellow phosphor, and blue phosphor.

The light emitting device package 100 may be disposed on a sub-mount or a circuit board. However, in the conventional light emitting device package is mounted on a sub-mount or a circuit board, a high temperature process such as a reflow may be applied. At this time, in the reflow process, a re-melting phenomenon occurs in the bonding region between the frame and the light emitting device provided in the light emitting device package, thereby weakening the stability of the electrical connection and the physical coupling.

However, the first bonding portion 51 and the second bonding portion 52 of the light emitting device according to the embodiment of the invention may be provided the driving power through at least one or both of the first frame 140 and the conductive portions 321 and 322. When the light emitting device package 100 is bonded through a reflow process, a re-melting phenomenon may not occur. The light emitting device package 100 may prevent damage, discoloration, or deterioration of the first and second bodies, and may prevent deterioration of electrical connection and physical bonding force.

The light emitting device 151 may include one or a plurality of light emitting cells therein. The light emitting cell may include at least one of an n-p junction, a p-n junction, an n-p-n junction, and a p-n-p junction. The plurality of light emitting cells may be connected in series with each other in one light emitting device. Accordingly, the light emitting device may have one or a plurality of light emitting cells, and when n light emitting cells are arranged in one light emitting device, the light emitting device may be driven at a driving voltage of n times. For example, when a driving voltage of one light emitting cell is 3V and two light emitting cells are arranged in one light emitting device, each light emitting device may be driven at a driving voltage of 6V. Alternatively, when the driving voltage of one light emitting cell is 3V and three light emitting cells are arranged in one light emitting device, each light emitting device may be driven at a driving voltage of 9V. The number of light emitting cells arranged in the light emitting device may be one or two to five.

According to the embodiment of the invention, the protection device 181 is embedded in the second body 118 without providing a space for a separate protection device in the cavity 112 in the high voltage light emitting device package 100, and may prevent the space loss by the protection device 181 and protect the light emitting device at a high voltage. In addition, the protection device 181 and the light emitting device 151 is first mounted on the first package body 101, and then the light emitting device 151 is adhered to the first resin 162, and the second body 118 may be adhered onto the first package body 101 by the adhesive member 160. At this time, the protection device 181 is inserted into the sub-cavity 180 concave on the outer lower portion of the second body 118, thereby eliminating the problem of bonding the protection device 181 through a post-process or molding with a reflective resin.

Figure 5:
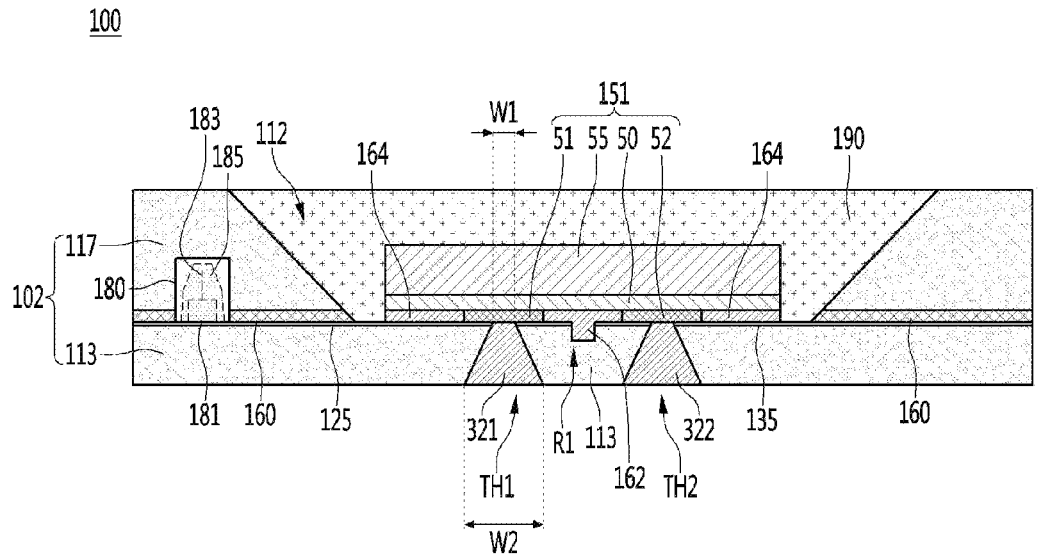
FIG. 5 is a first modified example of the light emitting device package according to the first embodiment of the invention.

FIG. 5 is a first modified example of the light emitting device package of FIG. 3. The same configuration as the above configuration is referred to the above description and may be selectively applied.

Referring to FIG. 5, the light emitting device package 100 according to the embodiment may include a package body 102 and a light emitting device 151. The package body 102 may include a first body 113 and a second body 117. The second body 117 may be disposed on the first body 113. The second body 117 may be disposed around an upper surface of the first body 113, and may provide a cavity 112 on the first body 113. The second body 117 may include a cavity 112 penetrating the upper and lower surfaces.

In other words, the first body 113 may be defined as a lower body, and the second body 117 may be defined as an upper body. The second body 117 may reflect light emitted from the light emitting device 120 in an upward direction. The second body 117 may be disposed to be inclined with respect to the upper surface of the first body 113. The package body 102 may include the cavity 112. The cavity 112 may include a bottom surface and a side surface inclined from the lower surface to the upper surface of the package body 102.

For example, the first and second bodies 113 and 117 may be formed of at least one selected from the group consisting of Polyphthalamide (PPA), polychloro triphenyl (PCT), liquid crystal polymer (LCP), polyamide 9T (PA9T), silicone, and epoxy molding compound (EMC), silicon molding compound (SMC), ceramic, polyimide (PI), photo sensitive glass (PSG), sapphire (Al2O3), and the like. In addition, the first and second bodies 113 and 117 may include reflective materials of high refractive fillers such as TiO2 and SiO2. At least one of the first and second bodies 113 and 117 may include a wavelength conversion material such as a quantum dot or a phosphor.

The first body 113 and the second body 117 may include different materials. For example, the first body 113 and the second body 117 may be combined after being formed of different materials in different processes. For example, the first body 113 and the second body 117 may be coupled to each other through the adhesive member 160. The adhesive member 160 may be disposed between the first body 113 and the second body 117. The adhesive member 160 may be disposed on an upper surface of the first body 113. The adhesive member 160 may be disposed on the lower surface of the second body 117. The adhesive member 160 may be disposed around the light emitting device 120 and may extend in the direction of the cavity 112 or may be exposed to the cavity 112.

Each of the first body 113 and the second body 117 may include at least one of a reflective material and a wavelength converting material. The first body 113 and the second body 117 may not include a reflective material and a wavelength converting material. The first body 113 and the second body 117 may be composed of a transparent resin. The first body 113 and the second body 117 may include different base materials. For example, the first body 113 may include a reflective material and the second body 117 may include a wavelength converting material. The first body 113 may include a wavelength conversion material and the second body 117 may include a reflective material. Alternatively, the first body 113 may include a reflective material and the second body 117 may include a reflective material and a wavelength converting material. Alternatively, the first body 113 may include a reflective material and a wavelength converting material, and the second body 117 may include a wavelength converting material.

In the light emitting device package 100 according to the embodiment, the first body 113 and the second body 117 including different base materials are formed separately in different processes, and may satisfy characteristics required by an application product, and may be manufactured in a modular manner through any possible combination. The method of manufacturing a light emitting device package according to an embodiment will be described later.

Figure 6:
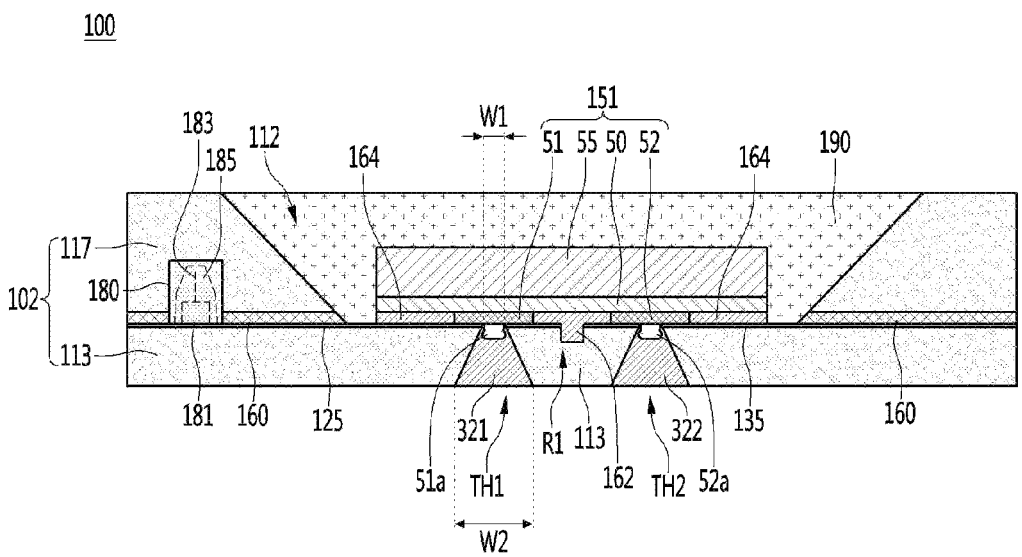
FIG. 6 is a second modified example of the light emitting device package according to the first embodiment of the invention.

In the light emitting device packages illustrated in FIGS. 5 and 6, since the package body 102 is formed, a lead frame is not applied. In the case of a light emitting device package to which the lead frame is applied, a process of forming the lead frame is additionally required, but the embodiment does not require a process of forming the lead frame. According to the method of manufacturing the light emitting device package, not only the process time is shortened but also the material may be reduced. In addition, in the case of the light emitting device package to which a conventional lead frame is applied, a plating process such as silver should be added to prevent deterioration of the lead frame. There is no need for additional steps such as silver plating. As such, the method of manufacturing the light emitting device package according to an embodiment of the invention has an advantage of reducing manufacturing cost and improving manufacturing yield. In addition, there is an advantage that may be miniaturized compared to the light emitting device package to which the conventional lead frame is applied.

According to an embodiment, the light emitting device 151 may include a first bonding portion 51, a second bonding portion 52, a light emitting structure 50, and a substrate 55. The configuration of the light emitting device 151 is referred to the above description and may be selectively applied.

The package body 102 may include a first through hole TH1 and a second through hole TH2 penetrating the upper and lower surfaces of the first body 113 from the bottom surface of the cavity 112. For example, the first body 113 may include a flat lower surface, and may include an upper surface parallel to the lower surface. The first and second through holes TH1 and TH2 may penetrate the upper and lower surfaces of the first body 113.

The first and second through holes TH1 and TH2 may be provided in the first body 113. The first through hole TH1 may be provided to overlap the first bonding portion 51 of the light emitting device 151 in the third direction from the upper surface of the first body 113 to the lower surface. The second through hole TH2 may be provided by penetrating the upper and lower surfaces of the first body 113 in the third direction. The second through hole TH2 may be disposed under the second bonding portion 52 of the light emitting device 151 and may overlap the second bonding portion 52.

The width W1 of the upper region of the first through hole TH1 may be smaller than or equal to the width of the lower surface of the first bonding portion 51. The width of the upper region of the second through hole TH2 may be smaller than or equal to the width of the lower surface of the second bonding portion 52. The first and second through holes TH1 and TH2 may gradually decrease in width toward the upper direction, and may be inclined or curved.

Side surfaces of the first and second through holes TH1 and TH2 may have a plurality of inclined surfaces having different inclinations or may be arranged to have a curved surface. A width between the first through hole TH1 and the second through hole TH2 may be provided in a range of 100 micrometers to 150 micrometers in the lower region of the first body 113.

The light emitting device package 100 according to the embodiment may include a first recess R1. The first recess R1 may be concave in a direction of lower surface from an upper surface of the first body 113 at the bottom surface of the cavity 112. One or more first recesses R1 may be disposed in the first body 113. The first recess R1 may be disposed under the light emitting device 151. The first recess R1 will be referred to the description disclosed above.

The light emitting device 151 may include a first resin 162 disposed below. The first resin 162 may be disposed in the first recess R1. The first resin 162 will be referred to the description disclosed above. The first resin 162 is disposed around the first bonding portion 51 and the second bonding portion 52, and the upper region of the first through hole TH1 and the upper region of the second through hole TH2 may be sealed.

The first resin 162 may provide a stable fixing force between the light emitting device 151 and the first body 113. For example, the first resin 162 may be disposed in direct contact with an upper surface of the first body 113. The first resin 162 may directly contact the lower surface of the light emitting device 151.

The depth of the first recess R1 may be smaller than the depth of the first through hole TH1 or the depth of the second through hole TH2. For example, the depth of the first recess R1 may be provided in several tens of micrometers. The depth of the first recess R1 may be provided to 20 micrometers to 60 micrometers. A width in the first direction of the first recess R1 may be provided to 140 micrometers to 160 micrometers.

Depths of the first and second through holes TH1 and TH2 may be provided corresponding to thicknesses of the first body 113. For example, the depths of the first and second through holes TH1 and TH2 may be provided at 180 micrometers to 220 micrometers. This is considered an injection process thickness that may provide crack free of the first body 113.

Metal layers 125 and 135 may be disposed between the first and second bodies 113 and 117. The metal layers 125 and 135 may be disposed on upper surfaces of the first body 113. The metal layers 125 and 135 may be separated from each other and provide an electrical path. The metal layers 125 and 135 may include first and second metal layers 125 and 135 spaced apart from each other, and the first and second metal layers 125 and 135 may be separated from each other based on the first recess R1.

The first and second metal layers 125 and 135 may be disposed between the adhesive member 160 and the first body 113. The first and second metal layers 125 and 135 may be exposed to the bottom surface of the cavity 112, and a portion of the first metal layer 125 may be exposed to the bottom surface of the sub-cavity 180.

The first metal layer 125 is disposed under the first bonding portion 51 of the light emitting device 151 and may be electrically connected to the first conductive portion 321 disposed in the first bonding portion 51 and the first through hole TH1. The first metal layer 125 may extend to the bottom surface of the sub-cavity 180 disposed outside the second body 117. The first metal layer 125 may be electrically connected to the first electrode 51 and the lower electrode of the protection device 181 disposed in the sub-cavity 180. The second metal layer 135 is disposed under the second bonding portion 52 of the light emitting device 151 and may be electrically connected to the second conductive portion 322 disposed in the second bonding portion 52 and the second through hole TH2. The second metal layer 135 may extend under the other side of the second body 117. The first and second metal layers 125 and 135 may include one material selected from the group consisting of titanium (Ti), copper (Cu), nickel (Ni), gold (Au), chromium (Cr), tantalum (Ta), and platinum (Pt), Tin (Sn), silver (Ag), phosphorus (P), or alloys thereof. The first and second metal layers 125 and 135 may be formed in a single layer or multiple layers.

Conductive portions 321 and 322 may be disposed in the first and second through holes TH1 and TH2. The conductive portions 321 and 322 may be provided in the first and second through holes TH1 and TH2. The first and second conductive portions 321 and 322 disposed in the first and second through holes TH1 and TH2 may be disposed under the first and second bonding portions 51 and 52. Upper and lower widths of the first and second conductive portions 321 and 322 may be smaller than upper and lower widths of the first and second bonding portions 51 and 52. The conductive portions 321 and 322 may be disposed in direct contact with lower surfaces of the first and second bonding portions 51 and 52. The conductive portions 321 and 322 may be electrically connected to the first and second bonding portions 51 and 52. The first conductive portion 321 may be in contact with and electrically connected to the first metal layer 125. The second conductive portion 322 may be in contact with and electrically connected to the second metal layer 135. The light emitting device package of FIGS. 5 and 6 may be provided without the conductive portions 321 and 322 or may have a structure having the conductive portions 321 and 322.

The conductive portions 321 and 322 may include one material selected from the group including Ag, Au, Pt, Sn, Cu, or an alloy thereof, or may be another conductive material.

The conductive portions 321 and 322 disposed in the first and second through holes TH1 and TH2 are solder pastes and may be formed by mixing powder particles or particle particles with flux. For example, the conductive portions 321 and 322 may be formed using a conductive paste. The conductive paste may include a solder paste, a silver paste, or the like, and may include a multilayer or a single layer composed of a multilayer or an alloy composed of different materials. For example, the conductive portions 321 and 322 may include a SAC (Sn—Ag—Cu) material or a SAC-based material.

At least one of the bonding portions 51 and 52 may be bonded by an intermetallic compound layer. The intermetallic compound may include at least one of CuxSny, AgxSny, and AuxSny, and the x may satisfy a condition of $0<x<1$, $y=1-x$, $x>y$. In the light emitting device package of the invention, a conductive material such as the conductive portions 321 and 322 or a conductive paste may be formed in at least one or both of the through holes TH1 and TH2. The conductive portions 321 and 322 disposed in the first and second through holes TH1 and TH2 are 30% or more, for example, 30% to 100% of the volume of the first and second through holes TH1 and TH2, and when it is less than the above range, the electrical reliability may be lowered, and when it is greater than the above range, the bonding force with the circuit board may be lowered due to the protrusion of the conductive portions 321 and 322.

The first bonding portion 51 of the light emitting device 151 may be formed in an alloy layer with an intermetallic compound (IMC) between the first conductive portion 321 and the first frame 120 or/and the first bonding portion 51 by a forming process of the first conductive portion 321 or heat treatment process after the first conductive portion 321 is provided and the material constituting the first conductive portion 321. The alloy layer may include at least one intermetallic compound layer selected from the group including AgSn, CuSn, AuSn, and the like. The intermetallic compound layer may be formed by combining a first material and a second material, a first material may be provided from the first conductive portion 321, and a second material may be provided from the first bonding portion 51.

The second bonding portion 52 of the light emitting device 151 may be formed in an alloy layer with an intermetallic compound (IMC) between the second conductive portion 322 and the second frame 130 or/and the second bonding portion 52 by a forming process of the second conductive portion 322 or a heat treatment process after the second conductive portion 322 is provided and the material constituting the second conductive portion 322. The alloy layer may include at least one intermetallic compound layer selected from the group including AgSn, CuSn, AuSn, and the like. The intermetallic compound layer may be formed by combining a first material and a second material, the first material may be provided from the second conductive portion 322, and the second material may be provided from the second bonding portion 52.

As shown in FIGS. 5 and 6, the light emitting device package 100 may include a second resin 164. The second resin 164 may be disposed around an outer periphery of the light emitting device 151. The second resin 164 may be adhered between the first and second metal layers 125 and 135 and the outer lower surface of the light emitting device 151. The second resin 164 may reflect light incident from the light emitting device 151. The thickness of the second resin 164 is smaller than an interval between the light emitting device 151 and the frames 125 and 135 so that the second resin 164 may be minimized to rise along the side of the light emitting device 151.

The second resin 164 may be formed in a continuous ring shape or frame shape along the periphery of the light emitting device 151, or may be formed in a discontinuous ring shape or frame shape spaced apart from the first body 113. For example, the second resin 164 may include at least one of an epoxy material, a silicon material, a hybrid material including an epoxy material and a silicon material. In addition, the second resin 164 may be a reflective portion that reflects light emitted from the light emitting device 151, and may be, for example, a resin including a reflective material such as TiO2 or, and may include white silicone. The second resin 164 may improve adhesion between the light emitting device 120 and the first and second metal layers 125 and 135.

When the second resin 162 includes a material having a reflective property such as white silicon, the second resin 162 reflects the light provided from the light emitting device 151 in an upward direction and light extraction efficiency of the light emitting device package 100 may be improved. The second resin 164 and the first resin 162 may be formed of the same material.

The first and second resins 162 and 164 may seal the lower periphery of the light emitting device 151 to prevent the conductive portions 321 and 322 from being diffused or moved. The first and second resins 162 and 164 may prevent electrical shorts on the side surfaces of the light emitting device 151 by the conductive portions 321 and 322 and may improve light extraction efficiency.

The protection device 181 may be disposed in the sub-cavity 180 concave under the second body 117. The protection device 181 may be connected to the first metal layer 125 disposed on the bottom of the sub-cavity 180, and the wire 183 connected to the protection device 181 may be connected to the second metal layer 135. The structure of the sub-cavity 180 will be described with reference to FIG. 4. The passivation portion 185 may mold the protection device 181 and the wire 183 and may adhere the protection device 181.

In the through holes TH1 and TH2 of the first body 113, although the bonding portions 51 and 52 of the light emitting device 151 are disposed on the through holes TH1 and TH2, the device as shown in FIG. 6 is described above, and the conductors 51a and 52a formed of a metal material may be disposed in the through holes TH1 and TH2 at a portion or a lower portion of the bonding portions 51 and 52. As illustrated in FIG. 6, in the light emitting device 151, the conductors 51a and 52a of the bonding portions 51 and 52 may be disposed less than 10% of the area of the lower surface of the light emitting device 151. The maximum area of the conductors 51a and 52a of each of the bonding portions 51 and 52 may be provided smaller than the upper area of the through holes TH1 and TH2. Accordingly, the conductors 51a and 52a of the bonding portions 51 and 52 of the light emitting device 151 may be inserted into the through holes TH1 and TH2. The lower surfaces of the conductors 51a and 52a of the bonding portions 51 and 52 of the light emitting device 151 may be lower than the upper surface of the first body 113. The conductors 51a and 52a of the bonding portions 51 and 52 of the light emitting device 151 are disposed in the through holes TH1 and TH2 and may be combined with the conductive portions 321 and 322 disposed in the through holes TH1 and TH2. The conductive portions 321 and 322 may contact around the conductors 51 and 52a of the bonding portions 51 and 52 of the light emitting device 151 to improve adhesion to the light emitting device 151. In this case, power may be supplied to each of the bonding portions 51 and 52 of the light emitting device 151 through the conductive portions 321 and 322. The conductors 51a and 52a are conductive materials, and may be provided as one material selected from the group including Al, Au, Ag, Pt, or an alloy thereof. The conductors 51a and 52a may be provided in a single layer or multiple layers.

The conductors 51a and 52a of the light emitting device 151 may be formed in an intermetallic compound (IMC) between the conductive portions 321 and 322 and the metal layers 125 and 135 by a forming process of the conductive portions 321 and 322 or a heat treatment process after the conductive portions 321 and 322 is provided and the material constituting the conductive portions 321 and 322. The conductive portions 321 and 322 may include one material selected from the group including Ag, Au, Pt, Sn, Cu, Zn, In, Bi, Ti, or an alloy thereof. However, the invention is not limited thereto, and a material capable of securing a conductive function may be used as the conductive portions 321 and 322. For example, the conductive portions 321 and 322 may be formed using a conductive paste. The conductive paste may include a solder paste, a silver paste, or the like, and may include a multilayer or a single layer composed of a multilayer or an alloy composed of different materials. For example, the conductive portions 321 and 322 may include a SAC (Sn—Ag—Cu) material.

For example, an alloy layer may be formed by bonding between a material forming the conductive portions 321 and 322 and a metal of the metal layers 125 and 135. Accordingly, the conductive portions 321 and 322 and the metal layers 125 and 135 may be physically and electrically stably bonded. The conductive portions 321 and 322, the alloy layer, and the metal layers 125 and 135 may be physically and electrically stably bonded. The alloy layer may include at least one intermetallic compound layer selected from the group including AgSn, CuSn, AuSn, and the like. The intermetallic compound layer may be formed by combining a first material and a second material, the first material may be provided from the conductive portions 321 and 322, and the second material may be provided from the bonding portion or may be the metal layers 125 and 135.

Figure 7:
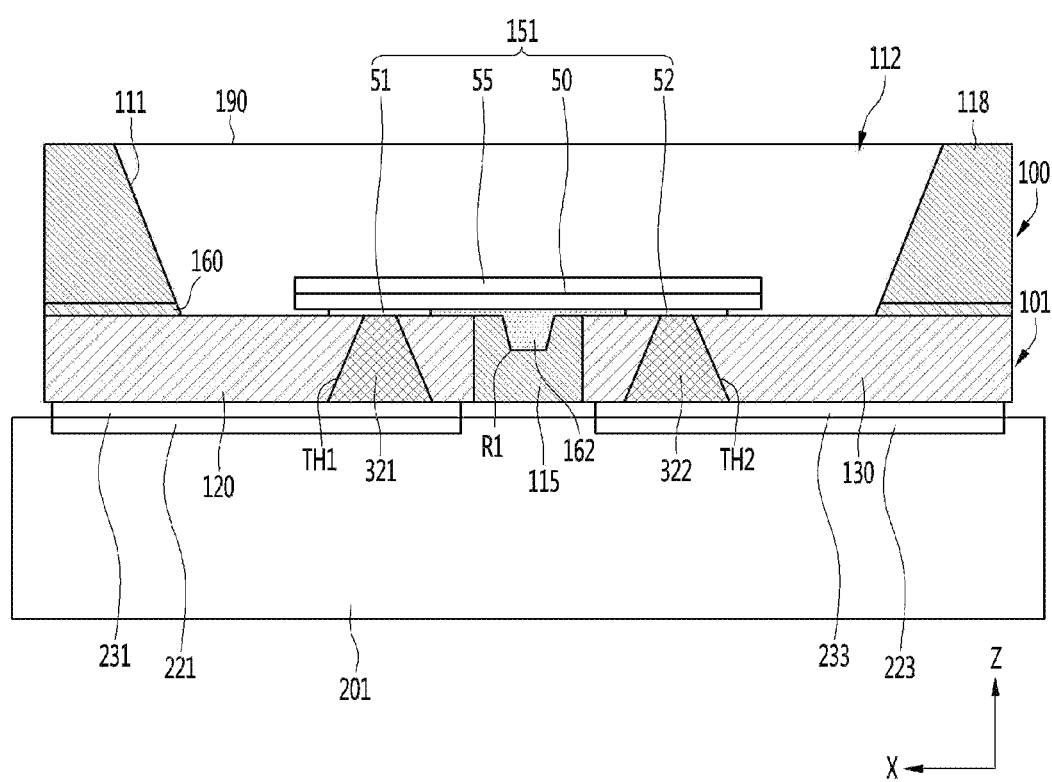
FIG. 7 is an example of a light source device or a light source module having the light emitting device package of FIG. 2.

FIG. 7 is an example of a light source device or a light source module in which the light emitting device package of FIG. 2 is disposed on a circuit board. As an example, a light source device having a light emitting device package according to an embodiment will be described as an example, and will be described below with reference to the above description and drawings. The light emitting device package may selectively apply the embodiment(s) disclosed above.

Referring to, FIGS. 2 and 7, in the light source module, one or a plurality of light emitting device packages 100 may be disposed on the circuit board 201.

The circuit board 201 may include a substrate member having pads 221 and 223. A power supply circuit for controlling the driving of the light emitting device 151 may be provided on the circuit board 201. The first conductive portion 321 and the first frame 120 of the light emitting device package 100 may be connected to the pads 221 and 223 of the circuit board 201 through bonding layers 231 and 233. Accordingly, the light emitting device 151 of the light emitting device package 100 may receive power from each of the pads 221 and 223 of the circuit board 201. Each pad 221 and 223 of the circuit board 201 may include, for example, at least one material selected from the group consisting of Ti, Cu, Ni, Au, Cr, Ta, Pt, Sn, Ag, P, Fe, Sn, Zn, Al, or alloys thereof.

According to the light emitting device package according to the embodiment, the bonding portions 51 and 52 of the light emitting device 151 may be selected to have a higher melting point of the first conductive portion 321 disposed in the through hole TH1 than the melting point of the general bonding material. The light emitting device package according to the embodiment has the advantage that the electrical connection and the physical bonding force do not deteriorate when the re-melting phenomenon does not occur when bonded to the main substrate through a reflow process. In the process of manufacturing the light emitting device package, the first body 115 and the second body 118 may be prevented from being exposed to high temperature, being damaged or discolored.

A method of manufacturing a light emitting device package according to an exemplary embodiment of the invention will be described with reference to FIGS. 8 to 11. Referring to, FIGS. 8 to 11, in the method of manufacturing a light emitting device package according to an embodiment of the invention, descriptions of details overlapping with those described with reference to FIGS. 1 to 3 may be omitted.

Figure 8:
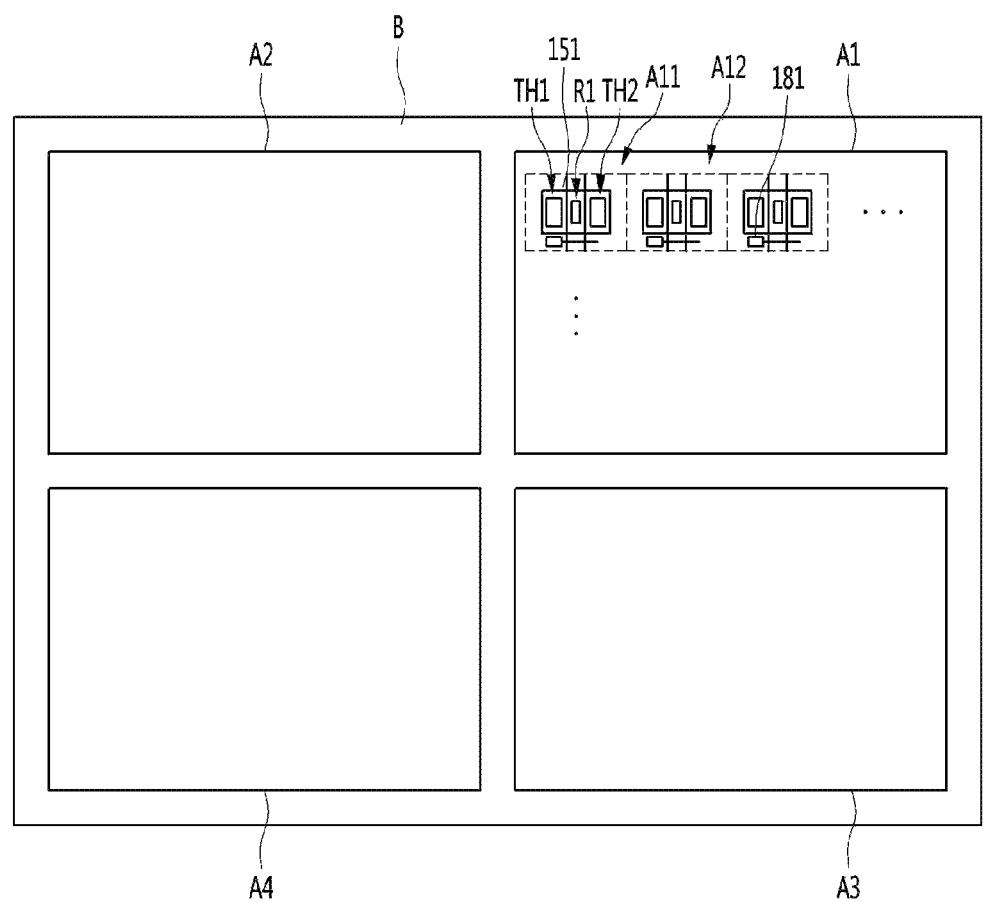
FIGS. 8 to 11 illustrate a method of manufacturing a light emitting device package according to a first embodiment of the invention.

As shown in FIG. 8, a support frame B and a plurality of first body arrays A1, A2, A3, and A4 disposed in the support frame B may be provided. The support frame B may stably support the plurality of first body arrays A1, A2, A3, and A4. The support frame B may be provided as an insulating frame, or may be provided as a conductive frame. For example, the plurality of first body arrays A1, A2, A3, and A4 may be formed through an injection process or the like. Although illustrated based on the case where four first body arrays A1, A2, A3, and A4 are disposed on the support frame B, the plurality of first body arrays may be provided in three or less, or may be provided in 5 or more. In addition, the plurality of first body arrays may be arranged in a shape having a plurality of rows and a plurality of columns, or may be arranged in a shape having one row and a plurality of columns. A plurality of sub body arrays A11, A12, etc., in each of the plurality of first body arrays A1, A2, A3 and A4, may include the package body 101, the first and the second through holes TH1 and TH2, and recesses R1, as shown in FIGS. 1 to 3. Each sub body array A11, A12, etc., may be formed in a similar structure to each other. The light emitting device 151 and the protection device 181 may be disposed in each of the sub body arrays A11, A12, etc.

The first through hole TH1 and the second through hole TH2 may be provided in the package body 101. The first through hole TH1 and the second through hole TH2 may be provided through the package body 101. The first through hole TH1 and the second through hole TH2 may be provided through the upper and lower surfaces of the package body 101 in the vertical direction. The first through hole TH1 and the second through hole TH2 may be spaced apart from each other. The first through hole TH1 and the second through hole TH2 are provided in the first and second frames 120 and 130 shown in FIGS. 2 and 3, or the first body shown in FIGS. 5 and 6, may be formed on.

The first recess R1 may be provided in the package body 101. The first recess R1 may be provided concave in a direction of the lower surface on an upper surface of the package body 101. The first recess R1 may be provided in the first body. As shown in FIGS. 1 to 6, a first resin 162 may be provided in the first recess R1, and the light emitting device 151 may be mounted. The first resin 162 may be provided to the first recess R1 through a doting method or the like. For example, the first resin 162 may be provided in a predetermined amount in a region where the first recess R1 is formed, and may be provided to overflow the first recess R1. In addition, the light emitting device 151 may be provided in the cavity 112. The protection device 181 may be disposed at a position spaced apart from the light emitting device 151.

In the process in which the light emitting device 151 is disposed on the package body 101, the first recess R1 may be used as an align key. The light emitting device 151 may be fixed to the package body 101 by the first resin 162. A portion of the first resin 162 provided in the first recess R1 may be hardened by being moved toward the first bonding portion 51 and the second bonding portion 52. Accordingly, the first resin 162 may be provided in a wide region between the lower surface of the light emitting device 151 and the upper surface of the package body 101, and may be improved an fixing force between the light emitting device 151 and the package body 101. The first bonding portion 51 and the second bonding portion 52 may be aligned with the through holes TH1 and TH2 of the first and second frames 120 and 130.

Figure 10:
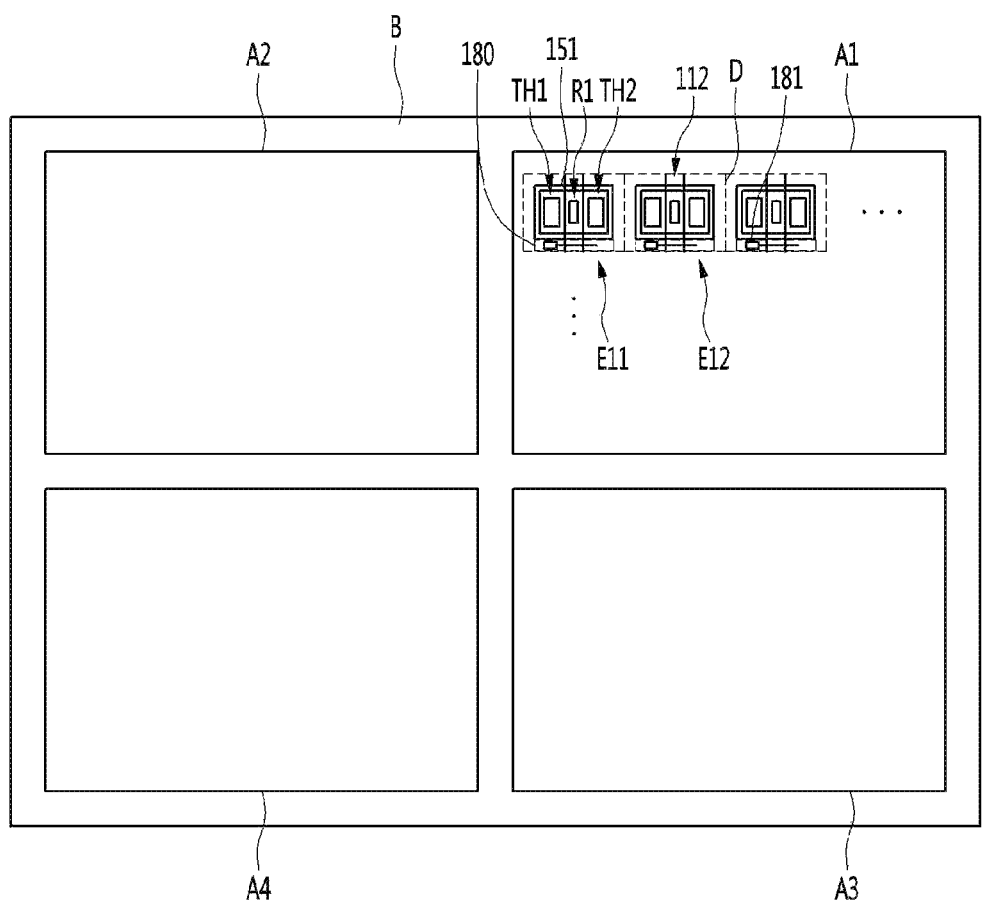

Referring to FIGS. 10 and 11, conductive portions 321 and 322 may be formed in the first and second through holes TH1 and TH2 of the sub body arrays A11 and A12, respectively. The conductive portions 321 and 322 may be disposed in direct contact with lower surfaces of the first and second bonding portions 51 and 52. The conductive portions 321 and 322 may be electrically connected to the bonding portions 51 and 52.

Before joining the second body array, an adhesive member 160 may be disposed on the package body 101 to cover the protection device 181 and the wire 183 using the passivation portion 185 of FIG. 3.

Figure 9:
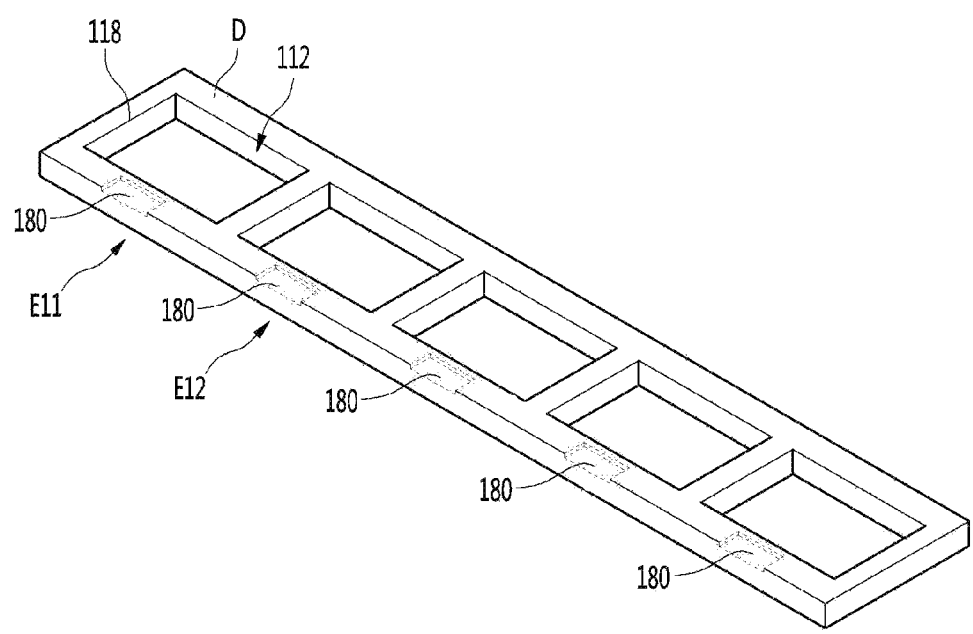

As shown in FIG. 9, a second body array D having a second body 118 may be provided. The second body array D may include a plurality of sub body arrays E11, E12, etc. For example, the second body array D may include the plurality of sub body arrays E11, E12, etc., arranged in one direction. In addition, the second body array D may include the plurality of sub body arrays E11, E12, etc., having a matrix shape arranged in a plurality of columns and a plurality of rows. Each of the plurality of sub body arrays E11, E12, etc., may include a cavity 112 penetrating from an upper surface to a lower surface direction. The sub-cavities 180 may be disposed in the sub-body arrays E11, E12, etc. of the second body array D, respectively. The sub-cavity 180 is a region in which the lower portion is open and may correspond to a region of the protection device 181.

As shown in FIG. 10, the second body array D may be provided on the first body arrays A1, A2, A3, and A4. The first body arrays A1, A2, A3, and A4 and the second body array D may be coupled through the adhesive member 160 as shown in FIGS. 1 to 3 and 11. For example, the sub body array E11 may be disposed on the sub body array A11, and the sub body array E12 may be disposed on the sub body array A12. Meanwhile, the first body arrays A1, A2, A3, and A4 and the second body array D may include different materials. For example, the first body arrays A1, A2, A3, and A4 and the second body array D may be formed of different materials in different processes, and then may be coupled to each other through the adhesive member 160.

The adhesive member 160 may be disposed between the first body arrays A1, A2, A3, and A4 and the second body array D. The adhesive member 160 may be disposed on an upper surface of the first body arrays A1, A2, A3, and A4.

The adhesive member 160 may be disposed on the lower surface of the second body array D. As shown in FIG. 11, the passivation portion 185 may cover the protection device 181 and the wire 183 disposed in the sub-cavity 180 of the second body 118.

The adhesive member 160 and the passivation portion 185 may include at least one of an epoxy-based material, a silicon-based material, a hybrid material including an epoxy-based material and a silicon-based material. Each of the first body arrays A1, A2, A3, and A4 and the second body array D may include at least one selected from a resin material including polyphthalamide (PPA), polychloro triphenyl (PCT), liquid crystal polymer (LCP), or PAST (Polyamide9T), silicone, epoxy molding compound (EMC), a silicone molding compound (SMC), polyimide (PI) and the like as a base material.

Subsequently, in a state in which the first body arrays A1, A2, A3, and A4 and the second body array D are coupled, a separation process such as dicing or scribing is performed in a unit package size as shown in FIG. 11. Through the individual light emitting device package as shown in FIGS. 1 to 3 may be manufactured.

The light emitting device package 100 according to the embodiment may include a package body 118 in which the package body 101 and the second body 118 are manufactured and coupled through a modular method.

The embodiment of the invention does not need to expose the body of the package to a high temperature in the process of manufacturing a light emitting device package and may prevent the damage or discoloration occurs. Accordingly, the range of selection for the material constituting the second body may be widened. According to an embodiment, the second body may be provided using a relatively inexpensive resin material as well as an expensive material such as a ceramic.

The light emitting device package of the invention has been described on the basis of a case where one through hole is provided under each bonding portion. However, according to the light emitting device package according to another example, a plurality of through holes may be provided under each bonding portion. In addition, the plurality of through holes may be provided as through holes having different widths. In addition, the shape of the through hole according to the embodiment may be provided in various shapes. For example, the through hole according to the embodiment may be provided with the same width from the upper region to the lower region. The through hole according to the embodiment may be provided in the shape of a multi-stage structure. For example, the through hole may be provided in a shape having a different inclination angle of the two-stage structure. In addition, the through hole may be provided in a shape having different inclination angles of three or more steps. The through hole may be provided in a shape in which the width thereof changes from the upper region to the lower region. For example, the through hole may be provided in a shape having a curvature while going from the upper region to the lower region.

Second Embodiment

Figure 12:
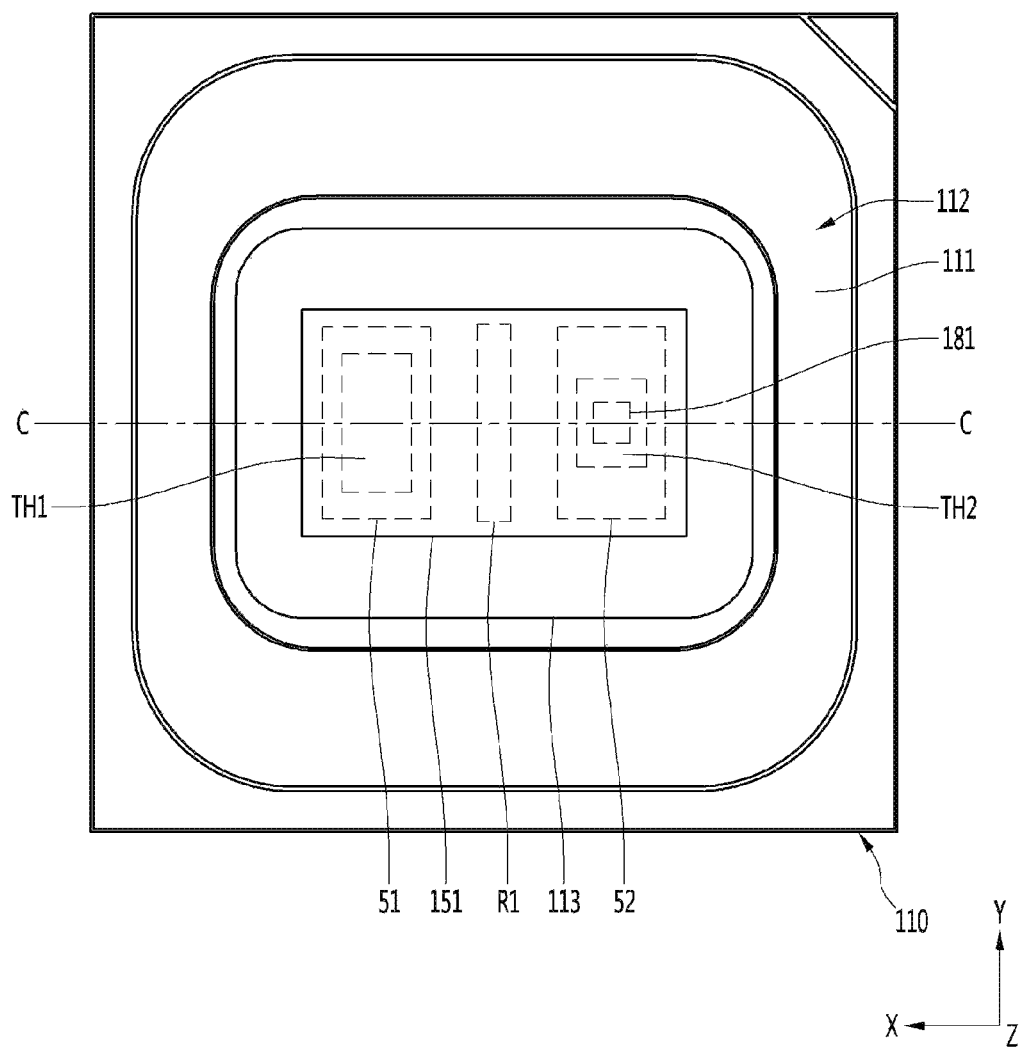
FIG. 12 is a plan view of a light emitting device package according to a second embodiment of the invention.
Figure 13:
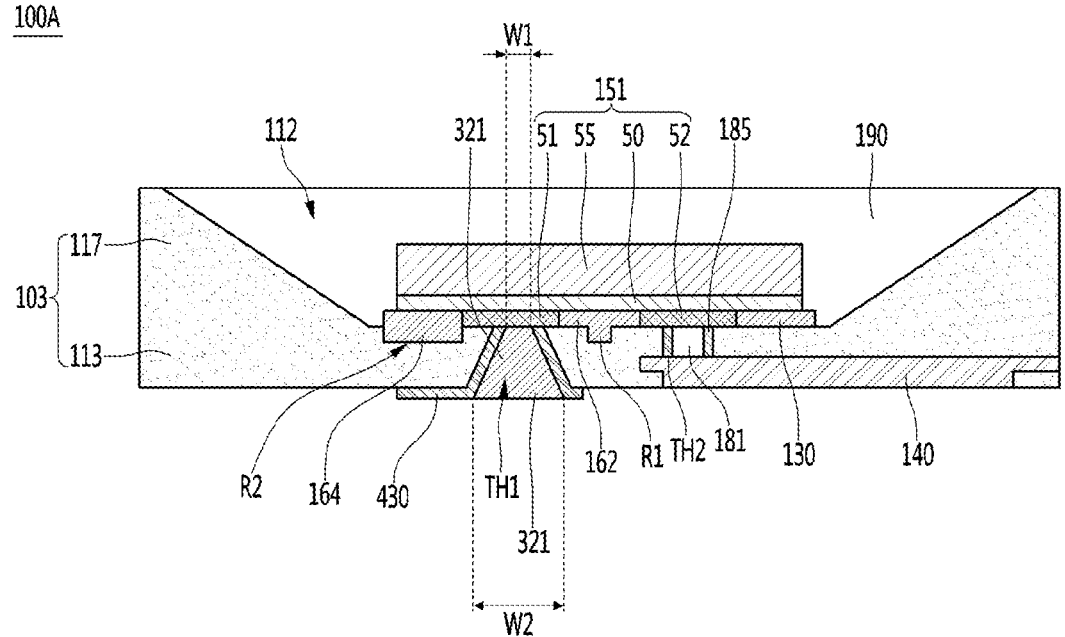
FIG. 13 is a cross-sectional view taken along the C-C side of the light emitting device package of FIG. 12.

A light emitting device package according to a second embodiment of the invention will be described with reference to FIGS. 12 and 13. FIG. 12 is a plan view of a light emitting device package according to a second embodiment of the invention, and FIG. 13 is a sectional view taken along the C-C side of the light emitting device package in FIG. 12. In describing the second embodiment, the same configuration as that of the first embodiment refers to the first embodiment and may be selectively applied to the second embodiment.

Referring to FIGS. 12 and 13, the light emitting device package 100A may include a package body 103 and a light emitting device 151 on the package body 103. The package body 103 may include a first body 113 and a second body 117. The second body 117 may be disposed on the first body 113. The second body 117 may be disposed around the upper portion of the first body 113. The second body 117 may provide a cavity 112 on an upper portion of the first body 113. The second body 117 may reflect the light emitted from the light emitting device 151 in an upward direction. The second body 117 may be inclined with respect to the upper surface of the first body 113. The first body 113 and the second body 117 may be formed of the same resin material or may be integrally formed. The package body 103 will be described with reference to FIGS. 5 and 6.

The package body 103 may include the cavity 112. The cavity 112 may include a lower surface and a side surface inclined from the lower surface to the upper surface of the package body 103. The package body 103 may be provided in a structure having the cavity 112, or may be provided in a structure having a flat top surface without the cavity 112. For example, the package body 103 may include at least one selected from the group consisting of Polyphthalamide (PPA), polychloro triphenyl (PCT), liquid crystal polymer (LCP), polyamide 9T (PA9T), silicone, and epoxy molding compound (EMC), silicon molding compound (SMC), ceramic, photo sensitive glass (PSG), sapphire (Al2O3), and the like. The package body 103 may include high refractive fillers such as TiO2 and SiO2.

The light emitting device 151 may include a first bonding portion 51, a second bonding portion 52, a light emitting structure 50, and a substrate 55.

The light emitting device package 100A may include a first through hole TH1. The package body 103 may include the first through hole TH1 penetrating the lower surface of the package body 103 from the bottom surface of the cavity 112. The first through hole TH1 may be provided in the first body 113. The first through hole TH1 may penetrate the upper and lower surfaces of the first body 113 in the vertical direction. The first through hole TH1 may be disposed under the first bonding portion 51 of the light emitting device 151. The first through hole TH1 may be provided to overlap the first bonding portion 51 of the light emitting device 151. The first through hole TH1 may be provided to overlap the first bonding portion 51 of the light emitting device 151 in a direction from the upper surface of the first body 113 to the lower surface.

The first frame 140 may be provided to the first body 113. The first frame 140 may be spaced apart from the first through hole TH1. A portion of the first frame 140 may be disposed under the second bonding portion 52 of the light emitting device 151. A portion of the first frame 140 may be disposed to overlap with the second bonding portion 52 in the vertical direction. The first frame 140 extends from the lower side of the second bonding portion 52 toward the outer side of the first body 113, and at least a portion thereof may be exposed to the outer surface and the bottom of the first body 113.

The first frame 140 may be a conductive frame, and for example, may function as a lead frame. The first frame 140 may be formed of at least one material selected from the group consisting of copper (Cu), titanium (Ti), nickel (Ni), gold (Au), chromium (Cr), tantalum (Ta), platinum (Pt), tin (Sn), silver (Ag), phosphorus (P) or an optional alloy. The first frame 140 may be formed in a single layer or a multilayer structure.

The first through hole TH1 and the first frame 140 may be spaced apart from each other. The first through hole TH1 and the first frame 140 may be spaced apart from each other under the light emitting device 151. The width W1 of the upper region of the first through hole TH1 may be smaller than or equal to the width of the first bonding portion 51. The width W1 of the upper region of the first through hole TH1 may be smaller than or equal to the width W2 of the lower region of the first through hole TH1. The first through hole TH1 may be provided in an inclined form in which the width gradually decreases from the lower region to the upper region.

As another example, the inclined surface between the upper region and the lower region of the first through hole TH1 may have a plurality of inclined surfaces having different inclinations, and the inclined surfaces may be disposed with curvature. An interval between the first through hole TH1 and the first frame 140 may be spaced apart by more than 100 micrometers in the lower region of the first body 113.

The width between the first through hole TH1 and the first frame 140 in the lower region of the first body 113 may be selected to be provided over a predetermined distance, when the light emitting device package according the embodiment is later mounted on a circuit board, a sub-mount, etc., in order to prevent a short between the bonding portions from occurring.

The package body 103 may include a second through hole TH2. The first body 113 may include a second through hole TH2. The second through hole TH2 may overlap the second bonding portion 52 of the light emitting device 151 in the vertical direction. The second through hole TH2 may be defined as a sub-cavity disclosed in the first embodiment.

The second through hole TH2 may be disposed between the first frame 140 and the second bonding portion 52. The second through hole TH2 may penetrate from an upper surface of the first body 113 to an upper surface of the first frame 140 in the vertical direction. The protection device 181 may be disposed in the second through hole TH2. The protection device 181 may be electrically connected between the light emitting device 151 and the first frame 140. The protection device 181 may be electrically connected to the second bonding portion 52 and the first frame 140.

The height of the second through hole TH2 may be smaller than the height of the first through hole TH1. The height of the second through hole TH2 is equal to the thickness of the protection device 181, or less than the thickness of the protection device 181, or as low as 30 micrometers based on the thickness of the protection device 181 and may be disposed to a depth of 30 micrometers or more. The second through hole TH2 may have an upper width the same as a lower width, or the lower width may be wider than the upper width. The width of the second through hole TH2 may be wider than a width of the protection device 181. The width of the second through hole TH2 may be four times or less than the width of the protection device 181, for example, more than 1.5 times and four times or less. When the width of the second through hole TH2 is smaller than the range, the protection device 181 may not be easily mounted. When the width of the second through hole TH2 is smaller than the range, the stiffness of the first body 113 adjacent to the first recess R1 may be reduced.

The protection device 181 may be disposed in the second through hole TH2, and a passivation portion 185 may be disposed around the protection device 181. Here, the protection device 181 is disposed on the first frame 140 and the passivation portion 185 surrounds the periphery of the protection device 181. In this case, the passivation portion 185 may expose the upper surface of the protection device 181, that is, the upper pad of the protection device 181. The passivation portion 185 prevents the short circuit of the protection device 181, prevents the bonding material from leaking along the first frame 140 through the second through hole TH2, and prevents a problem of short circuit which the second bonding portion 52 and the first frame 140 are connected to each other. The passivation portion 185 may be an insulating material, for example, a material such as silicon or epoxy, or may be a solder resist material. The passivation portion 185 may be a white resin material or a black resin material, and may improve light reflection efficiency or absorb light.

In forming the first body 113, first and second through holes TH1 and TH2 are formed, and the protection device 181 is disposed in the second through hole TH2, and then the passivation portion 185 may be filled. For example, the protection device 181 may be connected to the first frame 140 using a conductive paste. The protection device 181 may be connected to the second bonding portion 52 by using a conductive paste. The conductive paste may include a solder paste, a silver paste, or the like, and may include a multilayer or a single layer composed of a multilayer or an alloy composed of different materials. For example, the conductive paste may include a SAC (Sn—Ag—Cu) material or a SAC-based material. As another example, the upper/lower pads of the protection device 181 may be directly bonded to the second bonding portion 52 and the first frame 140.

Figure 18:
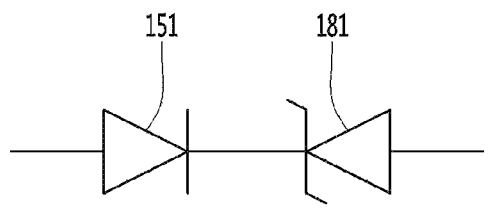
FIG. 18 is a circuit diagram illustrating a light emitting device package according to a second embodiment of the invention.

Referring to FIGS. 13 and 18, when the second bonding portion 141 of the light emitting device 151 is a cathode terminal, the upper pad of the protection device 181 is disposed as a cathode terminal, so that the light emitting device 151 and the protection device 181 may be connected to each other by the cathode terminal. Accordingly, when the normal driving voltage is applied through the first frame 140, the protection device 181 is turned on and transfers the driving voltage to the light emitting device 151 and the light emitting device 151 generates light. When an abnormal voltage is applied through the first frame 140, the protection device 181 is turned off and opens between the second bonding portion 52 and the first frame 140 of the light emitting device 151, and electrically protects the light emitting device 151.

The light emitting device package 100A may include recesses R1 and R2. The recesses R1 and R2 may be recessed from the bottom surface of the cavity 112 to the lower surface of the package body 103. The recesses R1 and R2 may be provided in the first body 113. In the recesses R1 and R2, the first recess R1 and the second recess R2 may be spaced apart from each other on the upper portion of the first body 113. The first recess R1 may be disposed between the first and second through holes TH1 and TH2 or may be disposed such that at least some or all of the regions overlap with the light emitting device 151 in the vertical direction. The first recess R1 is a region in which an upper portion of the first body 113 is recessed to be concave, and may be recessed in a lower surface direction from an upper surface of the first body 113. A portion of the first recess R1 may be disposed under the light emitting device 151.

The second recess R2 may be formed along the periphery of the light emitting device 151 or may be disposed in a portion of the outer portion of the light emitting device 151. The second recess R2 may be disposed between the side surface of the second body 117 or the cavity 112 and the first through hole TH1. The second recess R2 may be recessed in a direction of the lower surface from an upper surface of the first body 113. A portion of the second recess R2 may be disposed to overlap the outer region of the light emitting device 151, for example, at least one or both of the first and second bonding portions 51 and 52 in the vertical direction.

When viewed from an upper direction of the light emitting device 151, the first recess R1 may be disposed between the first bonding portion 51 and the second bonding portion 52, and the second recess R2 may be disposed outside the first bonding portion 51 and/or the second bonding portion 52. The first recess R1 may not be connected to the second recess R2, and may be separated or spaced apart from each other. The first recess R1 and the second recess R2 may be connected to each other.

The depth of the first recess R1 may be smaller than the depth of the first through hole TH1. The depth of the first recess R1 may be determined not to cause cracks in the light emitting device package 100A by considering a stable strength of the first body 113 and/or by the heat emitted from the light emitting device 151.

The light emitting device package 100A may include a first resin 162. The first resin 162 may be disposed in the first recess R1. The first resin 162 may be disposed between the light emitting device 151 and the first body 113. The first resin 162 may be adhered between the light emitting device 151 and the first body 113. The first resin 162 may be disposed between the first bonding portion 51 and the second bonding portion 52. For example, the first resin 162 may be disposed in contact with the side surface of the first bonding portion 51 and the side surface of the second bonding portion 52. The first resin 162 will be referred to the description of the first embodiment. For example, the depth of the first recess R1 may be provided to 20 micrometers to 60 micrometers. In addition, the width of the first recess R1 may be provided to 140 micrometers to 160 micrometers.

The second resin 164 may be disposed in the second recess R2. The second recess R2 may function as an upper recess disposed on the first body 113 or the frame. The second resin 164 may be disposed in a second recess R2 disposed between the first bonding portion 51 and the second body 117. The second resin 164 may be disposed between the first and second bonding portions 51 and 52 and the second body 117. For example, the second resin 164 may be disposed in contact with side surfaces of the first and second bonding portions 51 and 52.

The second resin 164 may provide a stable fixing force between the light emitting device 151 and the first body 113. For example, the second resin 164 may be disposed in direct contact with an upper surface of the first body 113. The second resin 164 may be disposed in direct contact with a lower periphery of the light emitting device 151. For example, the second resin 164 may include at least one of an epoxy material, a silicon material, a hybrid material including an epoxy material and a silicon material. may be. In addition, the second resin 164 may reflect light emitted from the lateral direction of the light emitting device 151. When the second resin 164 includes a reflection function, the second resin 164 may include white silicone. When the second resin 164 includes a reflection function, the second resin 164 may be formed of a material including, for example, TiO2, SiO2, Al2O3, or the like.

According to an embodiment, the depth of the second recess R2 may be provided smaller than the depth of the first through hole TH1. The depth of the second recess R2 may be determined in consideration of the adhesive force of the second resin 164. The depth of the second recess R2 may be determined not to cause cracks in the light emitting device package 100A by considering a stable strength of the first body 113 and/or by the heat emitted from the light emitting device 151. The second recess R2 may not be formed when the second body 117 is adjacent to the light emitting device 151 by the resin or the light efficiency is not improved. The second recess R2 may provide an appropriate space under the light emitting device 151 in which a kind of underfill process may be performed. The second recess R2 may be provided to be greater than or equal to a first depth so that the second resin 164 is sufficiently provided between the bottom surface of the light emitting device 151 and the top surface of the first body 113. In addition, the second recess R2 may be provided under a second depth in order to provide stable strength of the first body 113. The depth and width of the second recess R2 may affect the formation position and the fixing force of the second resin 164. The depth and width of the second recess R2 may be determined so that sufficient fixing force may be provided by the second resin 164 disposed between the first body 113 and the light emitting device 151. For example, the depth of the second recess R2 may be provided to 20 micrometers to 60 micrometers. In addition, the width of the second recess R2 may be provided to 140 micrometers to 160 micrometers. The first and second resins 162 and 164 provided to the first and second recesses R1 and R2 seal the peripheries of the first and second bonding portions 51 and 52 of the light emitting device 151.

According to an embodiment, the depth of the first through hole TH1 may be provided 2 times to 20 times the depth of the first and second recesses R1 and R2. For example, when the depth of the first through hole TH1 is provided at 200 micrometers, the depths of the first and second recesses R1 and R2 may be provided at 20 micrometers to 100 micrometers.

In the light emitting device package 100A, a phosphor layer may be formed on a surface of the light emitting device 151. The phosphor layer may include at least one or two or more of red phosphors, green phosphors, yellow phosphors, and blue phosphors.

The light emitting device package 100A may include the first conductive portion 321. The first conductive portion 321 may be spaced apart from the first frame 140 and the second through hole TH2. The first conductive portion 321 may be provided in the first through hole TH1. The first conductive portion 321 may be disposed under the first bonding portion 51. The width of the first conductive portion 321 may be provided smaller than the width of the first bonding portion 51. Here, the first bonding portion 51 may have a width in a second direction perpendicular to the first direction in which the first through hole TH1 is formed. The width of the first bonding portion 51 may be larger than the width of the first through hole TH1 in the second direction. The first conductive portion 321 may be disposed in direct contact with the lower surface of the first bonding portion 51. The first conductive portion 321 may be electrically connected to the first bonding portion 51. The first conductive portion 321 may be disposed to be surrounded by the first body 113. The first conductive portion 321 may include one material selected from the group consisting of Ag, Au, Pt, Sn, Cu, or an alloy thereof However, the invention is not limited thereto, and a material capable of securing a conductive function may be used as the first conductive portion 321. The first conductive portion 321 is a solder paste, and may be formed by mixing powder particles or particle particles with flux. For example, the first conductive portion 321 may be formed using a conductive paste. The conductive paste may include a solder paste, a silver paste, or the like, and may include a multilayer or a single layer composed of a multilayer or an alloy composed of different materials. For example, the first conductive portion 321 may include a SAC (Sn—Ag—Cu) material or a SAC-based material.

At least one of the bonding portions 51 and 52 may be bonded by an intermetallic compound layer. The intermetallic compound may include at least one of $Cu_xSn_y$, $Ag_xSn_y$, and $Au_xSn_y$, and the x may satisfy a condition of $0<x<1$, $y=1-x$, $x>y$. In the light emitting device package of the invention, a conductive material, for example, the conductive portion 321 or a conductive paste, may be formed in at least one or both of the through holes TH1 and TH2. The first conductive portion 321 disposed in the first through hole TH1 may be filled in a range of 30% or more, for example, 30% to 100% of the volume of the first through hole TH1, when it is smaller, the electrical reliability may be lowered, and when it is larger than the above range, the bonding force with the circuit board may be lowered due to the protrusion of the first conductive portion 321.

The first conductive portion 321 may be electrically connected to the first bonding portion 51, and the protection device 181 may be electrically connected to the second bonding portion 52. For example, external power may be supplied to the first conductive portion 321 and the first frame 140, and thus the light emitting device 151 may be driven.

The first and second resins 162 and 164 are fixed to the first and second recesses R1 and R2, and the first conductive portion 321 may be prevented from moving out of a region. In addition, the light emitting device 151 may be prevented from being electrically shorted by the first conductive portion 321, and a decrease in light extraction efficiency may be prevented.

As shown in FIG. 13, a metal layer 430 may be formed in the first through hole TH1. The metal layer 430 may be provided in the first through hole TH1. The metal layer 430 may be provided on sidewalls of the package body 103 that provides the first through hole TH1. The metal layer 430 may be disposed between the package body 103 that provides the first through hole TH1 and the first conductive portion 321. The metal layer 430 may be provided on a lower surface of the package body 103 adjacent to the first through hole TH1. The metal layer 430 may be formed of a material having good physical properties with respect to the package body 103. The metal layer 430 may be formed of a material having good physical properties with respect to the first conductive portion 321. Accordingly, the first conductive portion 321 may be stably provided in the first through hole TH1. According to an embodiment, when the adhesion between the first conductive portion 321 and the package body 103 is not good, the first conductive portion 321 may be provided stably by the metal layer 430 in the first through hole TH1.

Meanwhile, the light emitting device package according to the embodiment described above has been described based on the case where one through hole is provided under each bonding portion. However, according to the light emitting device package according to another embodiment, a plurality of through holes may be provided under each bonding portion. In addition, the plurality of through holes may be provided as through holes having different widths. In addition, the shape of the through hole according to the embodiment may be provided in various shapes. For example, the through hole according to the embodiment may be provided with the same width from the upper region to the lower region. The through hole according to the embodiment may be provided in the shape of a multi-stage structure. For example, the through hole may be provided in a shape having a different inclination angle of the two-stage structure. In addition, the through hole may be provided in a shape having different inclination angles of three or more steps. The through hole may be provided in a shape in which the width thereof changes from the upper region to the lower region. For example, the through hole may be provided in a shape having a curvature while going from the upper region to the lower region.

According to the light emitting device package according to the embodiment, the package body 103 may be provided to include only the first body 113 having a flat top surface and may not include the second body 117 disposed on the first body 113. One or more light emitting device packages may be disposed on a circuit board. In this case, the pad of the circuit board, the conductive portion 321, and the first frame 140 may be connected to each other. The pad of the circuit board may be connected to the metal layer 430. As another example, the first recess R1 may be formed as a hole penetrating from an upper surface to a lower surface of the first body 113. When the first recess R1 is formed as a vertical through hole, the first resin 162 may be exposed on the lower surface of the first body 113. In this case, the first resin 162 may be cured after the first resin 162 is not leaked by using the support sheet. The first body 103 may be an insulating body.

The light emitting device package according to the embodiment of the invention may include a molding portion 190. The molding portion 190 will be referred to the description of the first embodiment.

Since the protection device 181 is disposed in the second through hole TH2 of the first body 113 and the first frame 140 is connected to the light emitting device 151, the light emitting device 151 may be protected in a circuit manner and the light absorption loss of the light emitting device 151 may reduce due to the exposure of the protection device 181. The light emitting device 151 may include one or a plurality of light emitting cells therein. The light emitting cell may include at least one of an n-p junction, a p-n junction, an n-p-n junction, and a p-n-p junction. The plurality of light emitting cells may be connected in series with each other in one light emitting device. The number of light emitting cells arranged in the light emitting device may be one or two to five.

Figure 14:
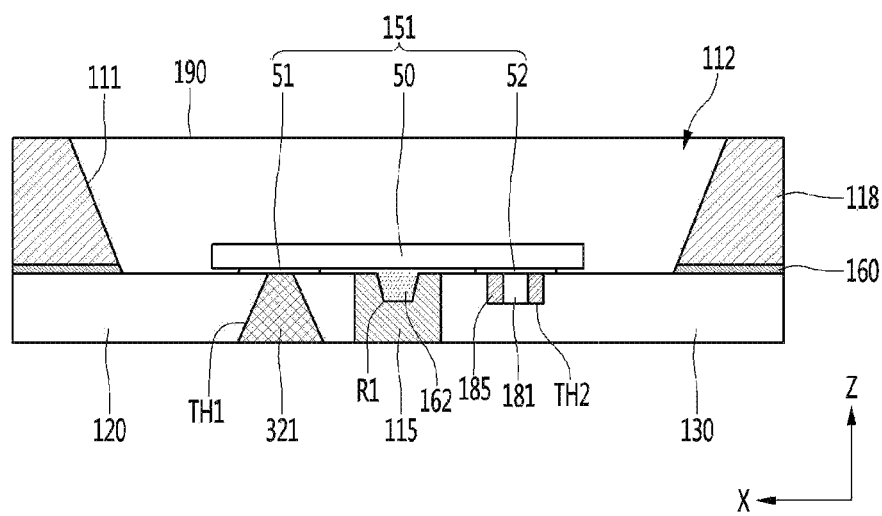
FIG. 14 is a side cross-sectional view illustrating a first modified example of the light emitting device package according to the second embodiment of the invention.

FIG. 14 is a first modified example of a light emitting device package according to the second embodiment of the invention.

Referring to FIG. 14, in the light emitting device package, first and second frames 120 and 130 may be disposed, and a first body 115 may be disposed between the first and second frames 120 and 130. The first body 115 may be disposed between the first and second frames 120 and 130 and may support the first and second frames 120 and 130. Here, the light emitting device 151 disposed on the first and second frames 120 and 130 and the first body 115 will be referred to the configuration and description disclosed above.

The first and second frames 120 and 130 may include the conductive frames disclosed above. The first frame 120 may be electrically connected to the first bonding portion 51 of the light emitting device 151, and the second frame 130 may be the second bonding portion 52 of the light emitting device 151 through the protection device 181.

The light emitting device package may include a second body 118. The second body 118 may have the cavity 112 and be coupled to the first and second frames 120 and 130. The second body 118 may be coupled on the first body 115. The second body 118 may be a resin material or a metallic material. The second body 118 of the metallic material may be electrically spaced apart from the first and second frames 120 and 130. The second body 118 of the metallic material may be formed of at least one material or an optional alloy selected from the group containing of titanium (Ti), copper (Cu), nickel (Ni), gold (Au), chromium (Cr), tantalum (Ta), platinum (Pt), tin (Sn), Silver (Ag), phosphorus (P). The second body 118 of the metal material may be formed in a single layer or a multilayer structure.

The adhesive member 160 may be disposed between the second body 118 and the first and second frames 120 and 130. The adhesive member 160 spaces the first and second frames 120 and 130 and the second body 118 from each other, and may be electrically insulated between the first and second frames 120 and 130 and the second body 118. The adhesive member 160 may be disposed around the bottom of the cavity 112 and may adhere the second body 118 to the first and second frames 120 and 130. The adhesive member 160 may adhered the first body 115 and the second body 118 disposed between the first and second frames 120 and 130. The adhesive member 160 may be a resin material such as silicone or epoxy or a tape material.

The first through hole TH1 may be disposed in at least one of the first and second frames 120 and 130, and the second through hole TH2 may be disposed in the other one of the first and second frames 120 and 130. The first through hole TH1 may be disposed in the first frame 120, and the second through hole TH2 may be disposed in the second frame 130. Here, the first through hole TH1 and the second through hole TH2 are holes having different depths, and the first through hole TH1 penetrates the upper and lower surfaces of the first frame 120. The second through hole TH2 may have a shape extending from an upper surface of the second frame 130 to an inside thereof. The depth of the first through hole TH1 is a depth in the Z direction, and may be the same as the thickness of the first frame 120, and the depth of the second through hole TH2 is less than a depth of the first through hole TH1 or less than a thickness of the second frame 130. The first through hole TH1 may overlap the first bonding portion 51 of the light emitting device 151 in the vertical direction Z. The second through hole TH2 may overlap the second bonding portion 52 of the light emitting device 151 in the vertical direction Z. The first and second through holes TH1 and TH2 may be spaced apart in the first direction X, and the first and second bonding portions 51 and 52 may be spaced apart in the first direction. The first through hole TH1 will be described with reference to FIG. 2.

The upper portion of the second frame 130 may include a second through hole TH2. The second through hole TH2 may overlap the second bonding portion 52 of the light emitting device 151 in the vertical direction. The second through hole TH2 may be disposed between the lower portion of the second frame 130 and the second bonding portion 52. The second through hole TH2 may be a recessed region or a concave portion disposed on the second frame 130. The protection device 181 may be disposed in the second through hole TH2. The protection device 181 may be electrically connected between the light emitting device 151 and the lower portion of the second frame 130. The protection device 181 may be electrically connected to the second bonding portion 52 and the second frame 130. The second bonding portion 52 may be disposed to be physically separated from the second frame 130. The height of the second through hole TH2 may be smaller than the height of the first through hole TH1. The height of the second through hole TH2 is equal to the thickness of the protection device 181, or less than the thickness of the protection device 181, or as low as 30 micrometers based on the thickness of the protection device 181 or may be arranged to a depth of 30 micrometers or more. The second through hole TH2 may have an upper width the same as a lower width, or have a lower width wider than an upper width thereof. The width of the second through hole TH2 may be wider than the width of the protection device 181. The width of the second through hole TH2 may be 4 times or less than the width of the protection device 181, for example, more than 1.5 times and 4 times or less. When the width of the second through hole TH2 is smaller than the range, the protection device 181 may not be easily mounted. When the width of the second through hole TH2 is greater than the range, a stiffness of the first body 113 adjacent to the first recess R1 may be reduced.

The width of the second through hole TH2 may be greater than the width of the second bonding portion 52 in the first direction. In this case, when the width of the second bonding portion 52 is larger than the width of the second through hole TH2, the second bonding portion 52 may be in contact with the second frame 130, there is a problem that the protection device 181 may not function as protection.

The protection device 181 may be disposed in the second through hole TH2, and a passivation portion 185 may be disposed around the protection device 181. Here, the protection device 181 is disposed on the upper portion of the second frame 130 and wrapped around the protection device 181 by the passivation portion 185. The passivation portion 185 may be an insulating material, for example, a material such as silicon or epoxy, or a solder resist material. The passivation portion 185 may be a white resin material or a black resin material, and may improve light reflection efficiency or absorb light.

In forming the first and second frames 120 and 130 and the first body 115, first and second through holes TH1 and TH2 are formed, and the protection device 181 is formed in the second through hole TH2, and then the passivation portion 185 may be filled.

As shown in FIGS. 14 and 18, when the second bonding portion 141 of the light emitting device 151 is a cathode terminal, the cathode terminal is disposed on the upper pad of the protection device 181, and the light emitting device 151 and the protection device 181 may be connected to each other by the cathode terminal. Accordingly, when the normal driving voltage is applied through the second frame 130, the protection device 181 is turned on to transfer the driving voltage to the light emitting device 151 and the light emitting device 151 generates light. The protection device 181 is turned off when an abnormal voltage is applied through the second frame 130, so that the second bonding portion 52 and the second frame 130 of the light emitting device 151 are turned off and opens between the second bonding portion 52 and the second frame 130 of the light emitting device 151, and electrically protects the light emitting device 151.

A top view of the first recess R1 may have a polygonal shape, an ellipse shape having a curved surface, or a circular shape. The first recess R1 may have a polygonal cross section, for example, a triangular or square shape, or a hemispherical shape. The configuration of the first recess R1 and the first resin 162 will be referred to the description disclosed above.

Figure 15:
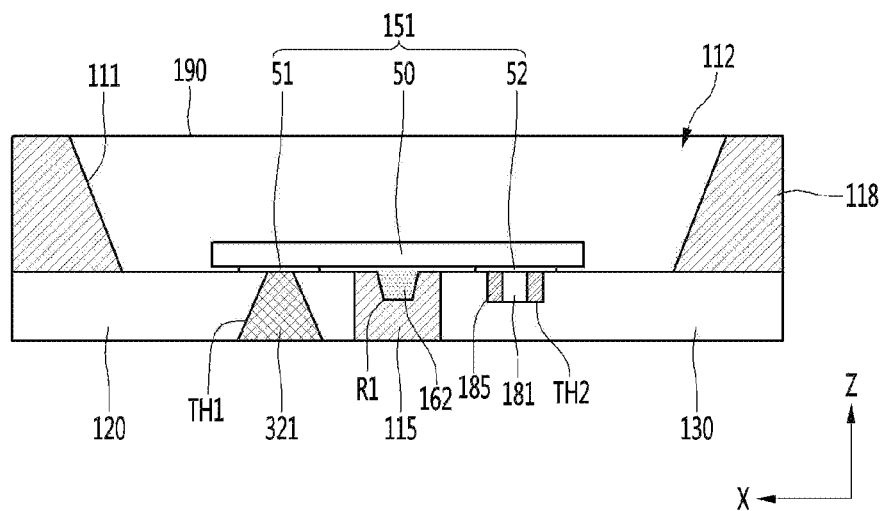
FIG. 15 is a side cross-sectional view illustrating a second modified example of the light emitting device package according to the second embodiment of the invention.

FIG. 15 is a modified example of the light emitting device package of FIG. 14. In the description of FIG. 15, parts different from those of FIG. 14 will be described.

Referring to FIG. 15, the light emitting device package may be formed of the same material as the first body 115 and the second body 118. The first body 115 may be disposed between the first and second frames 120 and 130. The first body 115 may be injection molded from the same material as the second body 118. The cavity 112 may be disposed in the second body 118, and the light emitting device 151 may be disposed in the cavity 112.

The first and second frames 120 and 130 and the first body 115 may be disposed to overlap the light emitting device 151 in the vertical direction. The first and second frames 120 and 130 may be disposed to overlap the first and second bonding portions 51 and 52 of the light emitting device 151 in the vertical direction.

One of the first and second frames 120 and 130 may include the first through hole TH1 and the first conductive portion 321, and the other may include the second through hole TH2 and the protection device 181. The above configuration will be referred to the description of FIG. 14.

The second resin 164 is disposed between the upper surfaces of the first and second frames 120 and 130 and the molding portion 190, and is the same as the lower surface of the light emitting device 151 or may be disposed lower than the lower surface of the light emitting device 151. The second resin 164 may be formed of a reflective resin material to reflect the light emitted from the light emitting device 151 in the lateral direction. In order to secure the thickness of the second resin 164, upper recesses concave in a lower surface direction may be disposed on the first and second frames 120 and 130 to fill the second resin 164.

Figure 16:
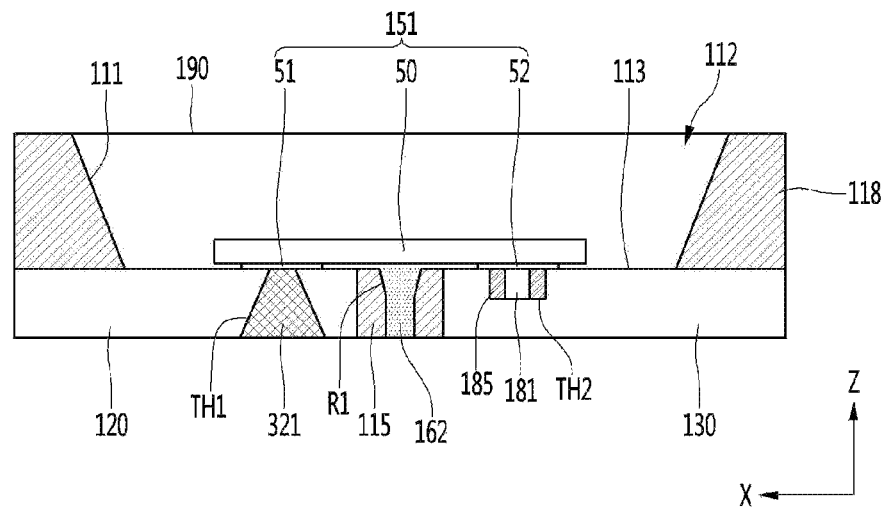
FIG. 16 is another example of the light emitting device package of FIG. 13.

FIG. 16 is a modified example of the light emitting device package of FIG. 15. In the description of FIG. 16, the same configuration as FIGS. 12 to 15 will be referred to FIGS. 12 to 15.

Referring to FIG. 16, in the light emitting device package, a first recess R3 may be disposed on the first body 115. The first recess R3 may penetrate in a direction of the lower surface from an upper surface of the first body 115. An upper width of the first recess R3 may be equal to or smaller than a lower width of the first recess R3. The first resin 162 may be disposed between the light emitting device 151 and the first body 115 and may adhered between the light emitting device 151 and the first body 115. A portion of the first resin 162 may be disposed between the first frame 120 and the light emitting device 151 to adhere the light emitting device 151 and the first frame 120. A portion of the first resin 162 may be disposed between the second frame 130 and the light emitting device 151 to adhere the light emitting device 151 and the second frame 130. A portion of the first resin 162 may be disposed in the first recess R1. A top view of the first recess R1 may have a polygonal shape, an ellipse shape having a curved surface, or a circular shape. The first recess R1 may have a polygonal cross section, for example, a triangular or square shape, or a hemispherical shape. According to an embodiment, the depth of the first recess R1 may be equal to the depth of the first through hole TH1. The depth and width of the first recess R1 may be determined not to cause cracks in the light emitting device package by considering a stable strength of the first body 115 and/or by heat emitted from the light emitting device 151. The first through hole TH1 is disposed in the first frame 120, the second through hole TH2 is disposed in the second frame 130, and the protection device 181 and the passivation portion 185 are disposed on the second frame 130.

As show in FIGS. 15 and 16, the protection device 181 may be electrically connected between the light emitting device 151 and the lower portion of the second frame 130. The protection device 181 may be electrically connected to the second bonding portion 52 and the second frame 130. The second bonding portion 52 may be disposed to be physically separated from the second frame 130.

The height of the second through hole TH2 may be smaller than the height of the first through hole TH1. The height of the second through hole TH2 is equal to the thickness of the protection device 181, or less than the thickness of the protection device 181, or as low as 30 micrometers based on the thickness of the protection device 181 or may be disposed to a depth of 30 micrometers or more. The second through hole TH2 may have an upper width and a lower width, or a lower width may be wider than an upper width. The width of the second through hole TH2 may be wider than the width of the protection device 181. The width of the second through hole TH2 may be four times or less than the width of the protection device 181, for example, more than 1.5 times and 4 times or less. When the width of the second through hole TH2 is smaller than the range, the protection device 181 may not be easily mounted. When the width of the second through hole TH2 is smaller than the range, a stiffness of the first body 113 adjacent to the first recess R1 may be reduced. The width of the second through hole TH2 may be greater than the width of the second bonding portion 52 in the first direction. In this case, when the width of the second bonding portion 52 is larger than the width of the second through hole TH2, the second bonding portion 52 is in contact with the second frame 130, there is a problem that the protection device 181 may not function as protection.

FIGS. 14 to 16, the light emitting device package according to the embodiment may include a first conductive portion 321. The first conductive portion 321 may be spaced apart from the first frame 140 and the second through hole TH2. The first conductive portion 321 may be provided in the first through hole TH1. The first conductive portion 321 may be disposed under the first bonding portion 51. The width of the first conductive portion 321 may be provided smaller than the width of the first bonding portion 51. The configuration of the first conductive portion 321 and the first through hole TH1 will be described with reference to FIG. 2 or the description of the above-described embodiment.

FIGS. 14 to 17, the frames 120 and 130 may include first and second metal layers, and the first metal layer may include Cu, Ni, and Ti as base layers, and may be formed in a single layer or multiple layers. The second metal layer may include at least one of Au, Ni, and Ag layers. When the second metal layer includes a Ni layer, the Ni layer has a small change for thermal expansion, so that the package body may be changed in size or placement by thermal expansion, in this case, the position of the light emitting device disposed on an upper portion of the Ni layer may be stably fixed by the Ni layer. When the second metal layer includes an Ag layer, the Ag layer may efficiently reflect light emitted from the light emitting device disposed above and improve luminous intensity. When the second metal layer includes an Au layer, bonding strength with the bonding portions 51 and 52 of the light emitting device 151 may be improved and reflection efficiency may be improved. The conductive portion 321 may include at least one material selected from the group including Ag, Au, Pt, Sn, Cu, Zn, In, Bi, Ti, or an alloy thereof.

Figure 17:
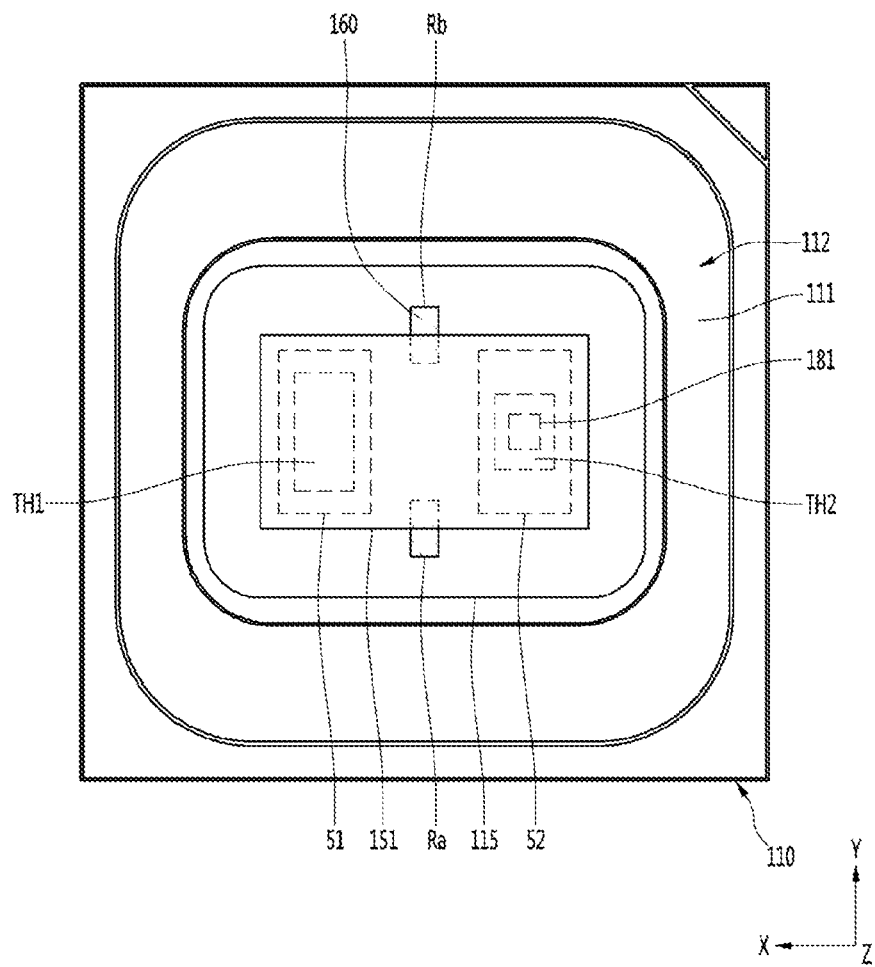
FIG. 17 is an example of a plan view of the light emitting device package of FIGS. 14 to 16.

FIGS. 14 to 16 may be implemented as the light emitting device package of FIG. 17. Referring to FIG. 17, a plurality of first recesses Ra and Rb may be disposed under the light emitting device 151 between the first and second frames 120 and 130. The plurality of first recesses Ra and Rb are disposed on an upper portion of the first body 115 disposed between the first and second frames 120 and 130, and may be arranged perpendicular to the first direction X and spaced apart from each other.

Each of the plurality of first recesses Ra and Rb may include an inner portion in which the light emitting devices 151 overlap in the vertical direction, and an outer portion extending outward from a side surface of the light emitting device 151. The plurality of first recesses Ra and Rb may be disposed adjacent to opposite sides of the light emitting device 151.

A first resin 162 is disposed between the first body 115 and a lower surface of the light emitting device 151, and the first resin 162 may adhere to the first body 115 and the light emitting device 151. In this case, a part of the first resin 162 may be cured after flowing into the first recesses Ra and Rb. The first recesses Ra and Rb may be guided during adhesion of the first resin 162 so that the first recesses Ra and Rb do not leak out to other portions, thereby preventing the first resin from being hardened and raised along the side of the light emitting device 151.

A ratio between the inner portion and the outer portion of the first recesses Ra and Rb may be a ratio of 4:6 to 6:4. A length of the inner portion of the first recesses Ra and Rb may be 50 micrometers or more, for example, in a range of 50 to 200 micrometers. When the length of the inner portion of the first recess Ra and Rb is greater than the length of the outer portion, the adhesive force by the first resin 162 may be improved, but light loss may occur. When the length of the outer portion of the first recesses Ra and Rb is greater than the length of the inner portion, the function of the first recesses Ra and Rb to support the first resin 162 may be deteriorated. The inner portions of the plurality of first recesses Ra and Rb may be disposed between the first and second bonding portions 51 and 52, or may be disposed outside than the outer peripheries of the first and second bonding portions 51 and 52. The plurality of first recesses Ra and Rb may be disposed closer to the side surface 111 of the cavity 112 than the first and second through holes TH1 and TH2. The outer portions of the plurality of first recesses Ra and Rb may be disposed closer to the side surfaces 111 of the cavity 112 than the light emitting devices 151.

The first recesses Ra and Rb may be spaced apart from the side surfaces 111 of the cavity 112, and the first resin 162 or the conductive paste may be prevent the problem to rise along the side 111 through the first recesses Ra and Rb.

In the light emitting device package according to the embodiment of the invention, a plurality of first recesses Ra and Rb are disposed in the second direction in a region of the first body 115 overlapping with the light emitting device 151, and thus, the first resin 162 may be adhered to the light emitting device 151 and the first body 115, the first bonding portion of the light emitting device 151 is electrically connected to the first frame 120 and the first conductive portion in the first through hole TH1, and the second bonding portion 52 of the light emitting device 151 is electrically connected to the second frame 130 through the protection device 181 in the second through hole TH2. Accordingly, the supporting force of the light emitting device 151 may be strengthened, and the protection device 181 may be disposed under the lower portion of the light emitting device 151 to reduce light loss and utilize the mounting space in the cavity 112.

Figure 19:
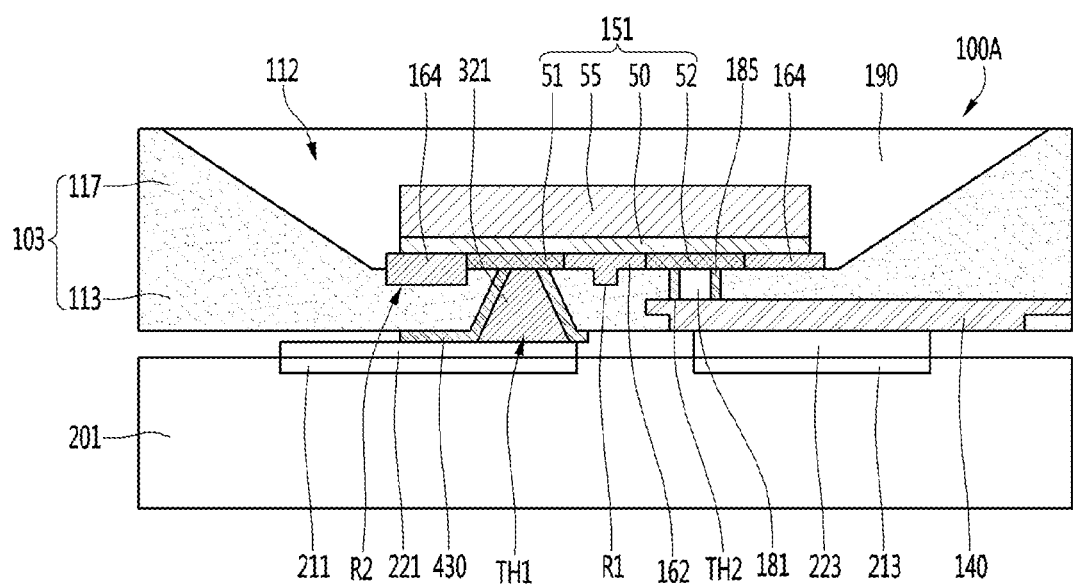
FIG. 19 is an example of a light source device or module having the light emitting device package of FIG. 13.

FIG. 19 is an example of a light source device or a light source module in which the light emitting device package of FIG. 13 is disposed on a circuit board. As an example, a light source device having a light emitting device package according to an embodiment will be described as an example, and will be described below with reference to the above description and drawings. The light emitting device package may selectively apply the embodiment(s) disclosed above.

Referring to FIGS. 13 and 19, in the light source module according to the embodiment, one or more light emitting device packages 100A may be disposed on the circuit board 201. The circuit board 201 may include a substrate member having pads 211 and 213. A power supply circuit for controlling the driving of the light emitting device 151 may be provided on the circuit board 201. The first conductive portion 321 and the first frame 140 of the light emitting device package 100A may be connected to the pads 211 and 213 of the circuit board 201 through bonding layers 221 and 223. Accordingly, the light emitting device 151 of the light emitting device package 100A may receive power from each of the pads 211 and 213 of the circuit board 201. Each pad 211, 213 of the circuit board 201 may include, for example, at least one selected from the group consisting of Ti, Cu, Ni, Au, Cr, Ta, Pt, Sn, Ag, P, Fe, Sn, Zn, Al, or an alloy thereof.

According to the light emitting device package according to the embodiment, the bonding portions 51 and 122 of the light emitting device 151 may be selected to have a higher melting point of the first conductive portion 321 disposed in the first through hole TH1 than the melting point of the general bonding material. The light emitting device package according to the embodiment does not cause re-melting when bonded to a main substrate through a reflow process, so that electrical connection and physical bonding force do not deteriorate, and the body of the package may be prevented from being damaged or discolored.

The first bonding portion of the light emitting device according to the embodiment may receive the driving power through the first conductive portion disposed in the first through hole. In addition, the melting point of the first conductive portion disposed in the first through hole may be selected to have a higher value than the melting point of the general bonding material. Therefore, the light emitting device package according to the embodiment does not cause a re-melting phenomenon when bonded to the main substrate through a reflow process, so that the electrical connection and the physical bonding force are not degraded.

One or more light emitting device packages according to the embodiment of the invention may be disposed on a circuit board and applied to a light source device. In addition, the light source device may include a display device, a lighting device, a head lamp, or the like according to an industrial field.

As an example of the light source device, the display device includes a bottom cover, a reflective portion disposed on the bottom cover, a light emitting module that emits light and includes a light emitting device, and a light disposed in front of the reflective portion and guiding light emitted from the light emitting module. An optical sheet including a light guide plate, prism sheets disposed in front of the light guide plate, a display panel disposed in front of the optical sheet, an image signal output circuit connected to the display panel and supplying an image signal to the display panel, It may include a color filter disposed in front. The bottom cover, the reflective portion, the light emitting module, the light guide plate, and the optical sheet may form a backlight unit. In addition, the display device does not include a color filter, and may have a structure in which light emitting devices emitting red, green, and blue light are disposed.

As another example of the light source device, the head lamp may include a light emitting module including a light emitting device package disposed on a substrate, a reflective portion reflecting light emitted from the light emitting module in a predetermined direction, for example, a front reflective portion. It may include a lens for refracting the light forward, and a shade for blocking or reflecting a portion of the light reflected by the reflective portion toward the lens to achieve a light distribution pattern desired by the designer.

Another example of a light source device may include a lighting device, a cover, a light source module, a heat sink, a power supply, an inner case, and a socket. In addition, the light source device according to the embodiment of the invention may further include any one or more of member and holder. The light source module may include a light emitting device package according to an embodiment of the invention.

Features, structures, effects, and the like described in the above embodiments are included in at least one embodiment, but are not necessarily limited to only one embodiment. Furthermore, the features, structures, effects, and the like illustrated in each embodiment may be combined or modified with respect to other embodiments by those skilled in the art to which the embodiments belong. Therefore, it should be interpreted that the contents related to such a combination and modification are included in the scope of the embodiments.

Although the above description has been made with reference to the embodiments, these are only examples and are not intended to limit the embodiments, and those skilled in the art to which the embodiments belong may have various modifications not exemplified above without departing from the essential characteristics of the embodiments. It will be appreciated that modifications and applications of the branches are possible. For example, each component specifically shown in the embodiment may be modified. And differences related to such modifications and applications will have to be construed as being included in the scope of the embodiments set forth in the appended claims.

The invention claimed is:

1. A light-emitting device package comprising:
a package body including a first frame, a second frame, and a first body disposed between the first frame and the second frame;
a second body disposed on the package body, the second body including a cavity and a sub-cavity spaced apart from the cavity;
a light emitting device disposed in the cavity and including a first bonding portion and a second bonding portion;
a protection device disposed in the sub-cavity; and
an adhesive member between the package body and the second body,
wherein the first frame has a first through hole, and the second frame has a second through hole,
wherein the first body includes a first recess overlapping the light emitting device in a vertical direction on of the first body,
wherein a first resin is included in the first recess, and
wherein the sub-cavity is concave toward an upper surface from a lower surface of the side wall constituting the cavity.

2. The light emitting device package of claim 1, further comprising
first and second conductive portions disposed in the first and second through holes and connected to the first and second bonding portions,
wherein the protection device is disposed on the first frame in the sub-cavity and electrically connected to the second frame.

3. The light emitting device package of claim 1, further comprising
a passivation portion disposed in the sub-cavity and covering the protection device,
wherein the adhesive member is formed of a same material as a material of the passivation portion.

4. The light emitting device package of claim 3, further comprising
an air gap between the passivation portion and a surface of the sub-cavity.

5. A light emitting device package comprising:
at least one frame;
a first body on the at least one frame and including a first through hole and a second through hole;
a second body disposed on the first body and having a cavity;
a light emitting device disposed in the cavity and including a first bonding portion and a second bonding portion; and
a protection device disposed in the second through hole,
wherein the first through hole overlaps the first bonding portion and the second through hole overlaps the second bonding portion.

6. The light emitting device package of claim 5, wherein depths of the first through hole and the second through hole are different from each other.

7. The light emitting device package of claim 5, wherein a first conductive portion is disposed in the first through hole, and
wherein the first conductive portion includes a material of the SAC (Sn—Ag—Cu) series.

8. The light emitting device package of claim 5, further comprising
a passivation portion disposed in the second through hole and protecting a periphery of the protection device.

9. A light emitting device package comprising:
at least one frame;
a first body disposed on the at least one frame and including a first through hole and a second through hole;
a second body disposed on the first body and having a cavity;
a light emitting device disposed in the cavity and including a first bonding portion and a second bonding portion;
a first recess concave in a lower surface direction from an upper surface of the first body;
a first resin in the first recess; and
a protection device disposed in the second through hole,
wherein the first through hole overlaps the first bonding portion, and the second through hole overlaps the second bonding portion in a vertical direction, and
wherein the first resin is adhered to the light emitting device and the first body.

10. The light emitting device package of claim 9, further comprising an adhesive layer coupled between the second body and the first body.

11. The light emitting device package of claim 9, wherein the first body and the second body are formed of a reflective resin.

12. The light emitting device package of claim 9, wherein the first recess is formed in a plurality that are spaced apart from each other on an upper portion of the first body.

13. The light emitting device package of claim 12, wherein each of the first recesses includes an inner portion overlapping the light emitting device in the vertical direction and an outer portion protruding outwardly of the light emitting device.

14. The light emitting device package of claim 12, wherein depths of the first through hole and the second through hole are different from each other.

15. The light emitting device package of claim 14, further comprising
a passivation portion protecting a periphery of the protection device in the second through hole.

16. The light emitting device package of claim 14, further comprising
a first conductive portion disposed in the first through hole.

17. The light emitting device package of claim 16, wherein the first conductive portion includes a material of the SAC (Sn—Ag—Cu) series.

18. The light emitting device package of claim 14, further comprising
a metal layer on a surface of the first through hole.

19. The light emitting device package of claim 18, wherein the metal layer extends to a lower surface of the first body.

* * * * *